(12) United States Patent
Fujita

(10) Patent No.: US 9,043,561 B2
(45) Date of Patent: May 26, 2015

(54) STORAGE DEVICE

(71) Applicant: Semiconductor Energy Laboratory Co., Ltd., Atsugi-shi, Kanagawa-ken (JP)

(72) Inventor: Masashi Fujita, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 211 days.

(21) Appl. No.: 13/873,388

(22) Filed: Apr. 30, 2013

(65) Prior Publication Data

US 2013/0297889 A1 Nov. 7, 2013

(30) Foreign Application Priority Data

May 2, 2012 (JP) ................. 2012-105466

(51) Int. Cl.
| | |
|---|---|
| *G06F 12/08* | (2006.01) |
| *G11C 16/00* | (2006.01) |
| *G11C 11/412* | (2006.01) |
| *G11C 11/413* | (2006.01) |

(52) U.S. Cl.
CPC ........ *G06F 12/0808* (2013.01); *G06F 12/0895* (2013.01); *G11C 16/00* (2013.01); *G11C 11/412* (2013.01); *G11C 11/413* (2013.01); *Y02B 60/1225* (2013.01)

(58) Field of Classification Search
CPC . G06F 12/0808; G06F 12/0895; G11C 16/00; G11C 11/412; G11C 11/413; Y02B 60/125
USPC ............. 711/144, 113, 118, 123, 125, 126; 365/49.1, 49.11, 49.15, 226
See application file for complete search history.

(56) References Cited

U.S. PATENT DOCUMENTS

| | | | | |
|---|---|---|---|---|
| 5,749,090 | A * | 5/1998 | Feng et al. ................ | 711/135 |
| 6,294,799 | B1 | 9/2001 | Yamazaki et al. | |
| 7,200,030 | B2 | 4/2007 | Yamaoka et al. | |
| 7,443,717 | B2 | 10/2008 | Fujita et al. | |
| 7,929,332 | B2 | 4/2011 | Fujita | |
| 2012/0257439 | A1 | 10/2012 | Kurokawa | |
| 2012/0274356 | A1 | 11/2012 | Takahashi | |
| 2012/0287702 | A1 | 11/2012 | Fujita | |
| 2012/0314512 | A1 | 12/2012 | Kurokawa | |
| 2014/0019823 | A1 * | 1/2014 | Ramirez et al. ........... | 714/755 |

FOREIGN PATENT DOCUMENTS

| | | |
|---|---|---|
| JP | 07-121444 A | 5/1995 |
| JP | 2007-059044 A | 3/2007 |
| JP | 2009-032387 A | 2/2009 |

* cited by examiner

*Primary Examiner* — Tan Nguyen
(74) *Attorney, Agent, or Firm* — Fish & Richardson P.C.

(57) ABSTRACT

To provide a storage device with low power consumption. The storage device includes a plurality of cache lines. Each of the cache lines includes a data field which stores cache data; a tag which stores address data corresponding the cache data; and a valid bit which stores valid data indicating whether the cache data stored in the data field is valid or invalid. Whether power is supplied to the tag and the data field in each of the cache lines is determined based on the valid data stored in the valid bit.

19 Claims, 11 Drawing Sheets

STORAGE DEVICE

BACKGROUND OF THE INVENTION

1. Field of the Invention

The disclosed invention relates to a storage device.

2. Description of the Related Art

Central processing units (CPUs) have a variety of architectures depending on their usage, and an architecture called a stored-program architecture is a predominant architecture of current CPUs. In a stored-program CPU, an instruction and data needed for carrying out the instruction are stored in a semiconductor storage device (hereinafter also simply referred to as a storage device), and the instruction and the data are sequentially read from the storage device, whereby the instruction is carried out.

As the storage device, besides a main storage device for storing data and instructions, a buffer storage device called a cache which can perform data writing and data reading at high speed is given. In order to reduce access to the low-speed main storage device and speed up the arithmetic processing, a cache is provided in a CPU to be located between an arithmetic unit or a control unit and a main storage device. In general, a static random access memory (SRAM) or the like is used as a cache. Patent Document 1 shown below discloses a configuration in which a volatile memory such as an SRAM and a nonvolatile memory are used in combination as a cache.

REFERENCE

[Patent Document 1] Japanese Published Patent Application No. H7-121444

SUMMARY OF THE INVENTION

In a CPU including a cache, an instruction or data which is frequently used, an instruction or data which is used once, and addresses where they are stored, in a main storage device, is copied from the main memory device and stored in the cache. Then, in general, an arithmetic unit or a control unit included in the CPU, first, determines whether a needed address exists in the cache, and reads an instruction or data corresponding to the address when the address exists. However, there is a possibility that a needed instruction or data is not stored in the cache. In this case, in the CPU, it is necessary that the instruction or data be read from an address in the low-speed main storage device and the address and the content of the instruction or data be copied to be stored in the cache; therefore, it takes long time to carry out the instruction as compared with the case where only an access to the cache is performed. A state where an instruction or data needed for the CPU is stored in the cache is called a cache hit, and a state where an instruction or data needed for the CPU is not stored in the cache is called a cache miss.

In order to reduce the frequency of the access to the low-speed main storage device as much as possible, it is effective to use a cache having large storage capacity in the CPU. A dynamic random access memory (DRAM) is advantageous in increasing the storage capacity. However, a DRAM needs refresh, and thus there is a limitation on an increase in the operation speed. On the other hand, an SRAM can operate at high speed. However, an SRAM is not suitable for increasing the capacity because it is difficult to increase the integration degree due to a large number of semiconductor elements per memory cell. Further, an SRAM has problems of an increase in leakage current of a semiconductor element and an increase in power consumption of a storage device because the number of semiconductor elements per memory cell is large.

In view of the above problems, an object of the disclosed invention is to provide a low-power-consumption storage device.

A cache includes a plurality of storage regions called cache lines each of which has a given amount of data. Each of the cache lines includes a storage region called a data field, a storage region called a tag, and a storage region called a valid bit. Cache data that is data or an instruction sent from a main storage device or an arithmetic unit is stored in the data field. Address data that is data of an address corresponding to the cache data is stored in the tag. Valid data that is data indicating whether the cache data stored in the data field is valid or invalid is stored in the valid bit.

In one embodiment of the disclosed invention, the data field and the tag in the cache line in which valid cache data is not stored of the plurality of cache lines are off, whereby low power consumption is achieved.

The cache line in which valid cache data is not stored is not used until valid cache data is written; thus, there is no problem even when storage regions other than the valid bit are off. Whether the storage regions other than the valid bit in the cache line is turned on or turned off is determined depending on the state of the valid bit in the cache line. When the valid bit indicates that data stored in the cache line is invalid, the tag and the data field in the cache line are turned off. On the other hand, the valid bit indicates that data stored in the cache line is valid, the tag and the data field in the cache line are turned on.

Hereinafter, a more specific configuration example will be described. In the valid bit, a first memory cell including a first data storage circuit which stores valid data is provided. In each of the tag and the data field, a second memory cell including a second data storage circuit which stores address data and cache data is provided.

When valid data of the valid bit is "1", a power supply potential is supplied to the second memory cell, so that the power supply potential is supplied to the tag and the data field connected to the valid bit. Accordingly, the tag and the data field in the cache line can be turned on.

When valid data of the valid bit is "0", a power supply potential is not supplied to the second memory cell, so that the power supply potential is not supplied to the tag and the data field connected to the valid bit. Accordingly, the tag and the data field in the cache line can be off.

A configuration example where a power supply potential is supplied or not supplied to the second memory cells of the tag and the data field will be more specifically described below.

To the second memory cell of each of the tag and the data field, a first transistor and a second transistor are electrically connected. A high-level power supply potential is supplied to one of a source and a drain of the first transistor, and a low-level power supply potential is supplied to one of a source and a drain of the second transistor. The second memory cell is electrically connected to the other of the source and the drain of the first transistor and the other of the source and the drain of the second transistor.

Valid data stored in the first data storage circuit in the first memory cell is output to a gate of the first transistor and a gate of the second transistor. When valid data of the valid bit is "1", the first transistor and the second transistor are turned on, so that a power supply potential is supplied to a second memory cell. Consequently, the tag and the data field in the cache line can be turned on.

On the other hand, when valid data of the valid bit is "0", the first transistor and the second transistor are turned off, so that a power supply potential is not supplied to the second memory cell. Consequently, the tag and the data field in the cache line can be turned off.

As described above, according to one embodiment of the disclosed invention, the tag and the data field can be controlled to be turned on and off in each cache line. Thus, a storage device which drives with low power consumption can be provided.

One embodiment of the disclosed invention is a storage device including a plurality of cache lines. Each of the cache lines includes a data field which stores cache data; a tag which stores address data corresponding the cache data; and a valid bit which stores valid data indicating whether the cache data stored in the data field is valid or invalid. When the valid data stored in the valid bit is output to the tag and data field, the tag and data field in each of the plurality of cache lines are turned on or off.

Another embodiment of the disclosed invention is a storage device including a plurality of cache lines. Each of the cache lines includes a data field which stores cache data; a tag which stores address data corresponding the cache data; and a valid bit which stores valid data indicating whether the cache data stored in the data field is valid or invalid. The valid bit includes a first memory cell. The tag and data field each includes a first transistor, a second transistor, and a second memory cell. A high-level power supply potential is supplied to one of a source and a drain of the first transistor. A ground potential is supplied to one of a source and a drain of the second transistor. The second memory cell is electrically connected to the other of the source and the drain of the first transistor and the other of the source and the drain of the second transistor. When the output potential of the first memory cell is supplied to a gate of the first transistor and a gate of the second transistor, the high-level power supply potential and the ground potential are supplied or not supplied to the second memory cell.

Another embodiment of the disclosed invention is a storage device including a first memory cell, a first transistor, a second transistor, and a second memory cell. The first memory cell includes a first data storage circuit which stores valid data and includes a first inverter and a second inverter. The output potential of the first inverter is input to a gate of the first transistor, and one of a source and a drain of the first transistor is supplied with a high-level power supply potential. The output potential of the second inverter is input to a gate of the second transistor, and one of a source and a drain of the second transistor is supplied with a low-level power supply potential. The second memory cell includes a second data storage circuit which is electrically connected to the other of the source and the drain of the first transistor and the other of the source and the drain of the second transistor, stores address data or cache data, and includes a third inverter and a fourth inverter.

Another embodiment of the disclosed invention is a storage device including a first memory cell, a first transistor, a second transistor, and a second memory cell. The first memory cell includes a first data storage circuit which stores valid data and includes a clocked inverter and a first inverter. The output potential of the first inverter is input to a gate of the first transistor, and one of a source and a drain of the first transistor is supplied with a high-level power supply potential. The output potential of the clocked inverter is input to a gate of the second transistor, and one of a source and a drain of the second transistor is supplied with a low-level power supply potential. The second memory cell includes a second data storage circuit which is electrically connected to the other of the source and the drain of the first transistor and the other of the source and the drain of the second transistor, stores address data or cache data, and includes a second inverter and a third inverter.

Another embodiment of the disclosed invention is a storage device including a first memory cell, a first transistor, a second transistor, and a second memory cell. The first memory cell includes a first data storage circuit which stores valid data and includes a first clocked inverter and a first inverter. The output potential of the first inverter is input to a gate of the first transistor, and one of a source and a drain of the first transistor is supplied with a high-level power supply potential. The output potential of the first clocked inverter is input to a gate of the second transistor, and one of a source and a drain of the second transistor is supplied with a low-level power supply potential. The second memory cell includes a second data storage circuit which is electrically connected to the other of the source and the drain of the first transistor and the other of the source and the drain of the second transistor, stores address data or cache data, and includes a second clocked inverter and a second inverter.

Another embodiment of the disclosed invention is a storage device which includes a plurality of cache lines each including a valid bit, a tag, and a data field. In each cache line, power is supplied to the tag and the data field in accordance with data stored in the valid bit.

Data indicating whether data stored in the data field is valid or invalid is stored in the valid bit. Thus, the storage capacity of the valid bit may be 1 bit. When data indicating that data stored in the data field is invalid is stored in the valid bit, power is not supplied to the tag and the data field. When data indicating that data stored in the data field is valid is stored in the valid bit, power is supplied to the tag and the data field.

According to one embodiment of the disclosed invention, a low-power-consumption storage device can be provided.

BRIEF DESCRIPTION OF THE DRAWINGS

In the accompanying drawings.

DETAILED DESCRIPTION OF THE INVENTION

Figure 1:
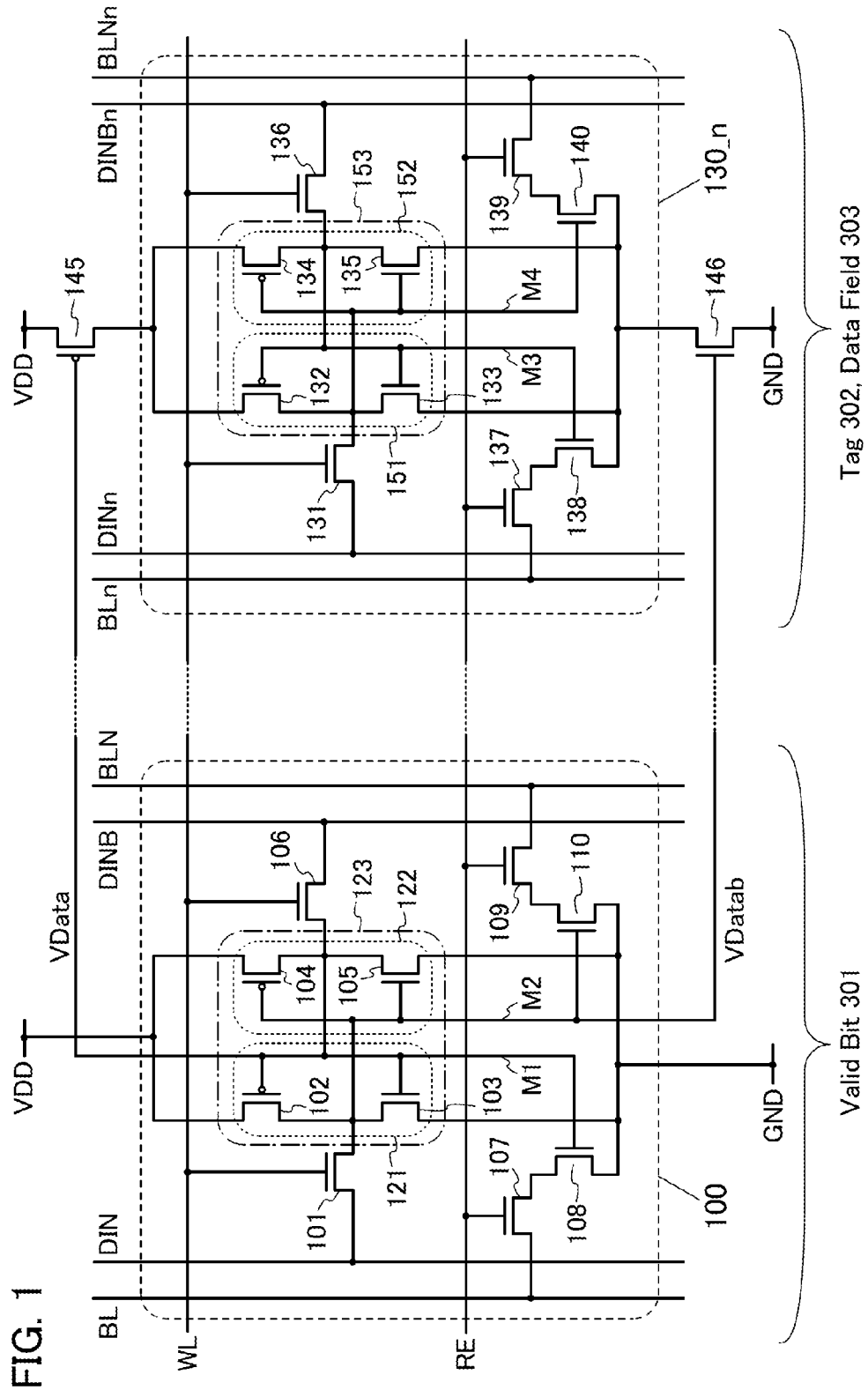
FIG. 1 is a circuit diagram of a storage device.

Embodiments of the invention disclosed in this specification will be hereinafter described with reference to the accompanying drawings. Note that the invention disclosed in this specification can be carried out in a variety of different modes, and it is easily understood by those skilled in the art that the modes and the details of the invention disclosed in this specification can be changed in various ways without departing from the spirit and the scope thereof. Therefore, the disclosed invention is not construed as being limited to description of the embodiments. Note that, in the drawings hereinafter shown, the same portions or portions having similar functions are denoted by common reference numerals, and repeated description thereof will be omitted. Further, in some cases, the same hatching patterns are applied to similar portions, and the similar portions are not necessarily designated by reference numerals.

Note that in the invention disclosed in this specification, a semiconductor device refers to an element or a device which functions by utilizing a semiconductor and includes, in its category, an electric device including an electronic circuit, a display device, a light-emitting device, a storage device, and the like and an electrical appliance on which the electric device is mounted.

Note that the position, the size, the range, or the like of each component illustrated in the drawings and the like is not accurately represented in some cases for the sake of simplicity. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

Functions of a "source" and a "drain" are sometimes replaced with each other when a transistor of opposite polarity is used or when the direction of flow of current is changed in circuit operation, for example. Therefore, the terms "source" and "drain" can be used to denote the drain and the source, respectively, in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the terms "over" and "below" do not necessarily mean "directly on" and "directly under", respectively, in the description of a positional relation between components. For example, the expression "a gate electrode over a gate insulating film" can mean the case where there is an additional component between the gate insulating film and the gate electrode.

Embodiment 1

A storage device of this embodiment will be described below.
<Configuration of Memory Cell and Structure of Transistor>
FIG. 1 is a circuit diagram illustrating the configurations of a memory cell of a valid bit and a memory cell of a tag and a data field in a cache memory of this embodiment.
<Configuration of Valid Bit>
A memory cell 100 of a valid bit 301 illustrated in FIG. 1 includes a first transistor 101, a second transistor 102, a third transistor 103, a fourth transistor 104, a fifth transistor 105, a sixth transistor 106, a seventh transistor 107, an eighth transistor 108, a ninth transistor 109, and a tenth transistor 110. The transistors except the second transistor 102 and the fourth transistor 104 are n-channel transistors. The second transistor 102 and the fourth transistor 104 are p-channel transistors.

To the memory cell 100 of the valid bit 301 illustrated in FIG. 1, a high-level power supply potential VDD and a ground potential GND (0 V) as a low-level power supply potential VSS are supplied. Although the ground potential GND (0 V) is supplied as the low-level power supply potential VSS in this embodiment, the disclosed invention is not limited thereto; any potential lower than the high-level power supply potential VDD can be used as the low-level power supply potential VSS. Note that in this specification, a high-level potential VH is higher than a low-level potential VL. The high-level power supply potential VDD may be used as the high-level potential VH. The low-level power supply potential VSS may be used as the low-level potential VL. In this embodiment, a description will be given of the case where the high-level power supply potential VDD and the low-level power supply potential VSS are used as the high-level potential VH and the low-level potential VL, respectively.

To the memory cell 100 of the valid bit 301 illustrated in FIG. 1, a word line WL to which a potential WL is supplied, a read line RE to which a potential RE is supplied, a first data line DIN to which a potential DIN is supplied, a second data line DINB to which a potential DINB is supplied, a first bit line BL to which a potential BL is supplied, a second bit line BLN to which a potential BLN is supplied, a third data line VData from which a potential VData is output, and a fourth data line VDatab from which a potential VDatab is output are electrically connected.

Note that the high-level potential VH or the low-level potential VL is supplied to the word line WL, the read line RE, the first data line DIN, the second data line DINB, the first bit line BL, the second bit line BLN, the third data line VData, and the fourth data line VDatab.

Different potentials selected from the high-level potential VH and the low-level potential VL are supplied to the first data line DIN and the second data line DINB. Specifically, when the potential DIN is the high-level potential VH, the potential DINB is the low-level potential VL, whereas when the potential DIN is the low-level potential VL, the potential DINB is the high-level potential VH.

Further, different potentials selected from the high-level potential VH and the low-level potential VL are supplied to the third data line VData and the fourth data line VDatab. Specifically, when the potential VData is the high-level potential VH, the potential VDatab is the low-level potential VL, whereas when the potential VData is the low-level potential VL, the potential VDatab is the high-level potential VH.

A gate of the first transistor 101 is electrically connected to the word line WL and a gate of the sixth transistor 106. One of a source and a drain of the first transistor 101 is electrically connected to the first data line DIN. The other of the source and the drain of the first transistor 101 is electrically connected to one of a source and a drain of the second transistor 102, one of a source and a drain of the third transistor 103, a gate of the fourth transistor 104, a gate of the fifth transistor 105, a gate of the tenth transistor 110, and the fourth data line VDatab.

A gate of the second transistor 102 is electrically connected to the third data line VData, a gate of the third transistor 103, one of a source and a drain of the fourth transistor 104, one of a source and a drain of the fifth transistor 105, one of a source and a drain of the sixth transistor 106, and a gate of the eighth transistor 108. The one of the source and the drain of the second transistor 102 is electrically connected to the other of the source and the drain of the first transistor 101, the one of the source and the drain of the third transistor 103, the gate of the fourth transistor 104, the gate of the fifth transistor 105, the gate of the tenth transistor 110, and the fourth data line VDatab. The other of the source and the drain of the second transistor 102 is supplied with the high-level power supply potential VDD and electrically connected to the other of the source and the drain of the fourth transistor 104.

The gate of the third transistor 103 is electrically connected to the third data line VData, the gate of the second transistor 102, the one of the source and the drain of the fourth transistor 104, the one of the source and the drain of the fifth transistor 105, the one of the source and the drain of the sixth transistor 106, and the gate of the eighth transistor 108. The one of the source and the drain of the third transistor 103 is electrically connected to the other of the source and the drain of the first transistor 101, the one of the source and the drain of the second transistor 102, the gate of the fourth transistor 104, the gate of the fifth transistor 105, the gate of the tenth transistor 110, and the fourth data line VDatab. The other of the source and the drain of the third transistor 103 is supplied with the ground potential GND and electrically connected to the other of the source and the drain of the fifth transistor 105, one of a source and a drain of the eighth transistor 108, and one of a source and a drain of the tenth transistor 110.

The gate of the fourth transistor 104 is electrically connected to the other of the source and the drain of the first transistor 101, the one of the source and the drain of the second transistor 102, the one of the source and the drain of the third transistor 103, the gate of the fifth transistor 105, the gate of the tenth transistor 110, and the fourth data line VDatab. The one of the source and the drain of the fourth transistor 104 is electrically connected to the third data line VData, the gate of the second transistor 102, the gate of the third transistor 103, the one of the source and the drain of the fifth transistor 105, the one of the source and the drain of the sixth transistor 106, and the gate of the eighth transistor 108. The other of the source and the drain of the fourth transistor 104 is supplied with the high-level power supply potential VDD and electrically connected to the other of the source and the drain of the second transistor 102.

The gate of the fifth transistor 105 is electrically connected to the fourth data line VDatab, the other of the source and the drain of the first transistor 101, the one of the source and the drain of the second transistor 102, the one of the source and the drain of the third transistor 103, the gate of the fourth transistor 104, and the gate of the tenth transistor 110. The one of the source and the drain of the fifth transistor 105 is electrically connected to the third data line VData, the gate of the second transistor 102, the gate of the third transistor 103, the one of the source and the drain of the fourth transistor 104, the one of the source and the drain of the sixth transistor 106, and the gate of the eighth transistor 108. The other of the source and the drain of the fifth transistor 105 is supplied with the ground potential GND and electrically connected to the other of the source and the drain of the third transistor 103, the one of the source and the drain of the eighth transistor 108, and the one of the source and the drain of the tenth transistor 110.

The gate of the sixth transistor 106 is electrically connected to the word line WL and the gate of the first transistor 101. The one of the source and the drain of the sixth transistor 106 is electrically connected to the third data line VData, the gate of the second transistor 102, the gate of the third transistor 103, the one of the source and the drain of the fourth transistor 104, the one of the source and the drain of the fifth transistor 105, and the gate of the eighth transistor 108. The other of the source and the drain of the sixth transistor 106 is electrically connected to the second data line DINB.

A gate of the seventh transistor 107 is electrically connected to the read line RE and a gate of the ninth transistor 109. One of a source and a drain of the seventh transistor 107 is electrically connected to the first bit line BL. The other of the source and the drain of the seventh transistor 107 is electrically connected to the other of the source and the drain of the eighth transistor 108.

The gate of the eighth transistor 108 is electrically connected to the third data line VData, the gate of the second transistor 102, the gate of the third transistor 103, the one of the source and the drain of the fourth transistor 104, the one of the source and the drain of the fifth transistor 105, and the one of the source and the drain of the sixth transistor 106. The one of the source and the drain of the eighth transistor 108 is supplied with the ground potential GND and electrically connected to the other of the source and the drain of the third transistor 103, the other of the source and the drain of the fifth transistor 105, and the one of the source and the drain of the tenth transistor 110. The other of the source and the drain of the eighth transistor 108 is electrically connected to the other of the source and the drain of the seventh transistor 107.

The gate of the ninth transistor 109 is electrically connected to the read line RE and the gate of the seventh transistor 107. One of a source and a drain of the ninth transistor 109 is electrically connected to the second bit line BLN. The other of the source and the drain of the ninth transistor 109 is electrically connected to the other of the source and the drain of the tenth transistor 110.

The gate of the tenth transistor 110 is electrically connected to the other of the source and the drain of the first transistor 101, the one of the source and the drain of the second transistor 102, the one of the source and the drain of the third transistor 103, the gate of the fourth transistor 104, the gate of the fifth transistor 105, and the fourth data line VDatab. The one of the source and the drain of the tenth transistor 110 is supplied with the ground potential GND and electrically connected to the other of the source and the drain of the third transistor 103, the other of the source and the drain of the fifth transistor 105, and the one of the source and the drain of the eighth transistor 108. The other of the source and the drain of the tenth transistor 110 is electrically connected to the other of the source and the drain of the ninth transistor 109.

Figure 2:
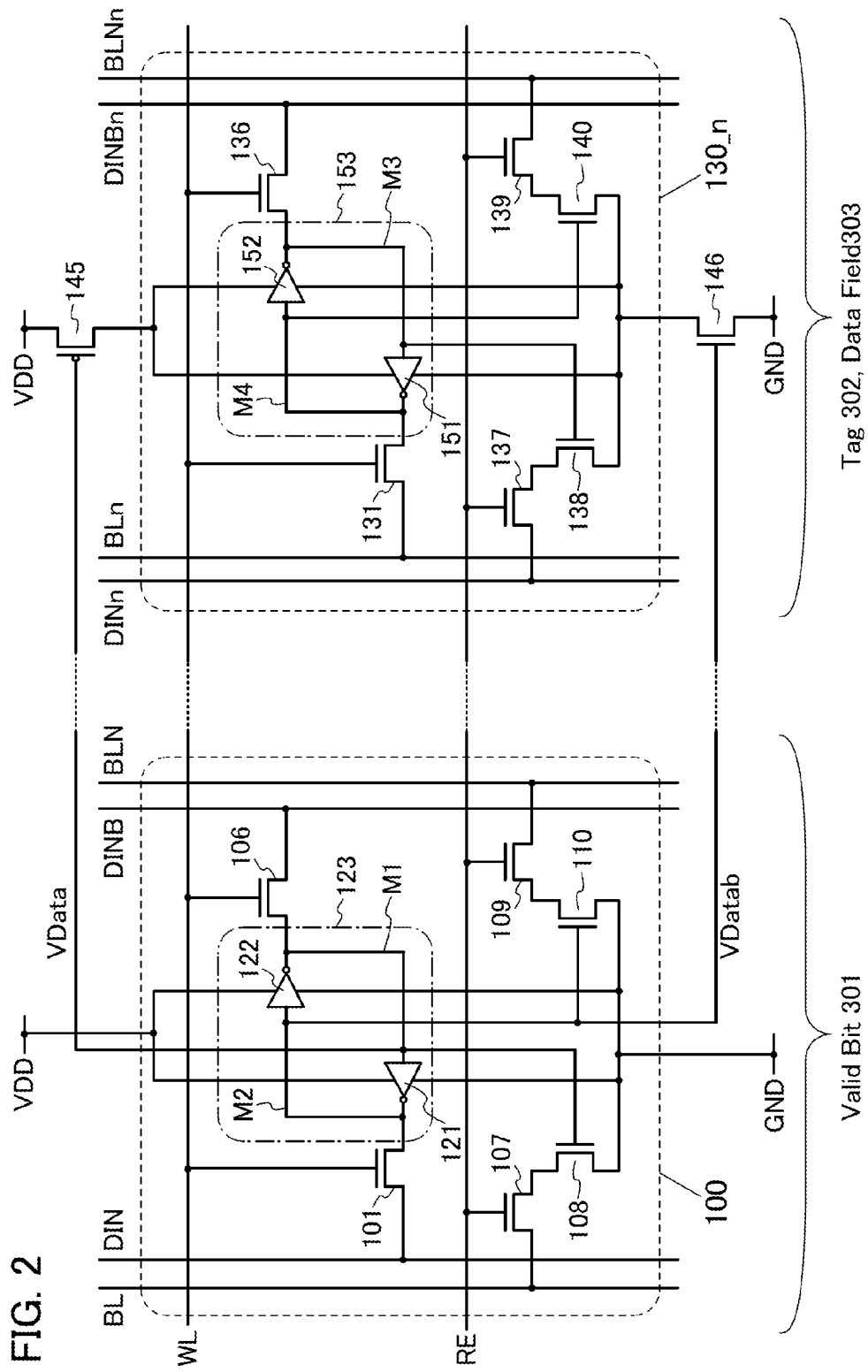
FIG. 2 is a circuit diagram of a storage device.

In the memory cell 100 illustrated in FIG. 1, the second transistor 102, which is a p-channel transistor, and the third transistor 103, which is an n-channel transistor, are included in a first inverter 121. The fourth transistor 104, which is a p-channel transistor, and the fifth transistor 105, which is an n-channel transistor, are included in a second inverter 122. FIG. 2 is a circuit diagram where the first inverter 121 and the second inverter 122 are denoted by circuit symbols.

In FIGS. 1 and 2, the gate of the second transistor 102 and the gate of the third transistor 103 (collectively referred to as an input terminal of the first inverter 121), and the one of the source and the drain of the fourth transistor 104 and the one of the source and the drain of the fifth transistor 105 (collectively referred to as an output terminal of the second inverter 122) are electrically connected to a node M1. The one of the source and the drain of the second transistor 102 and the one of the source and the drain of the third transistor 103 (collectively referred to as an output terminal of the first inverter 121), and the gate of the fourth transistor 104 and the gate of the fifth transistor 105 (collectively referred to as an input terminal of the second inverter 122) are electrically connected to a node M2. The potential of the node M1 is the output potential of the second inverter 122 and is the potential VData. The potential of the node M2 is the output potential of the first inverter 121 and is the potential VDatab.

The first inverter 121 and the second inverter 122 are included in a data storage circuit 123. The output terminal of the first inverter 121 is electrically connected to the input terminal the second inverter 122. The output terminal of the second inverter 122 is electrically connected to the input terminal of the first inverter 121. Valid data input to the memory cell 100 of the valid bit 301 is stored in the data storage circuit 123.

<Configurations of Tag and Data Field>

A tag 302 and a data field 303 illustrated in FIG. 1 include a plurality of memory cells 130. FIG. 1 illustrates an example of the circuit configuration of a given memory cell 130_n (n is a natural number) of the plurality of memory cells 130 included in the tag 302 and the data field 303. The memory cell 130_n includes a first transistor 131, a second transistor 132, a third transistor 133, a fourth transistor 134, a fifth transistor 135, a sixth transistor 136, a seventh transistor 137, an eighth transistor 138, a ninth transistor 139, and a tenth transistor 140. Further, an eleventh transistor 145 and a twelfth transistor 146 are electrically connected to the memory cell 130_n. The transistors except the second transistor 132, the fourth transistor 134, and the eleventh transistor 145 are n-channel transistors. The second transistor 132, the fourth transistor 134, and the eleventh transistor 145 are p-channel transistors.

To the memory cell 130_n, the high-level power supply potential VDD and the ground potential GND (0 V) as the low-level power supply potential VSS are supplied.

A gate of the first transistor 131 is electrically connected to the word line WL and a gate of the sixth transistor 136. One of a source and a drain of the first transistor 131 is electrically connected to a first data line DINn connected to the memory cell 130_n. The other of the source and the drain of the first transistor 131 is electrically connected to one of a source and a drain of the second transistor 132, one of a source and a drain of the third transistor 133, a gate of the fourth transistor 134, a gate of the fifth transistor 135, and a gate of the tenth transistor 140.

A gate of the second transistor 132 is electrically connected to a gate of the third transistor 133, one of a source and a drain of the fourth transistor 134, one of a source and a drain of the fifth transistor 135, one of a source and a drain of the sixth transistor 136, and a gate of the eighth transistor 138. The one of the source and the drain of the second transistor 132 is electrically connected to the other of the source and the drain of the first transistor 131, the one of the source and the drain of the third transistor 133, the gate of the fourth transistor 134, the gate of the fifth transistor 135, and the gate of the tenth transistor 140. The other of the source and the drain of the second transistor 132 is electrically connected to the other of the source and the drain of the fourth transistor 134 and one of a source and a drain of the eleventh transistor 145.

The gate of the third transistor 133 is electrically connected to the gate of the second transistor 132, the one of the source and the drain of the fourth transistor 134, the one of the source and the drain of the fifth transistor 135, the one of the source and the drain of the sixth transistor 136, and the gate of the eighth transistor 138. The one of the source and the drain of the third transistor 133 is electrically connected to the other of the source and the drain of the first transistor 131, the one of the source and the drain of the second transistor 132, the gate of the fourth transistor 134, the gate of the fifth transistor 135, and the gate of the tenth transistor 140. The other of the source and the drain of the third transistor 133 is electrically connected to the other of the source and the drain of the fifth transistor 135, one of a source and a drain of the eighth transistor 138, one of a source and a drain of the tenth transistor 140, and one of a source and a drain of the twelfth transistor 146.

The gate of the fourth transistor 134 is electrically connected to the other of the source and the drain of the first transistor 131, the one of the source and the drain of the second transistor 132, the one of the source and the drain of the third transistor 133, the gate of the fifth transistor 135, and the gate of the tenth transistor 140. The one of the source and the drain of the fourth transistor 134 is electrically connected to the gate of the second transistor 132, the gate of the third transistor 133, the one of the source and the drain of the fifth transistor 135, the one of the source and the drain of the sixth transistor 136, and the gate of the eighth transistor 138. The other of the source and the drain of the fourth transistor 134 is electrically connected to the other of the source and the drain of the second transistor 132 and the one of the source and the drain of the eleventh transistor 145.

The gate of the fifth transistor 135 is electrically connected to the other of the source and the drain of the first transistor 131, the one of the source and the drain of the second transistor 132, the one of the source and the drain of the third transistor 133, the gate of the fourth transistor 134, and the gate of the tenth transistor 140. The one of the source and the drain of the fifth transistor 135 is electrically connected to the gate of the second transistor 132, the gate of the third transistor 133, the one of the source and the drain of the fourth transistor 134, the one of the source and the drain of the sixth transistor 136, and the gate of the eighth transistor 138. The other of the source and the drain of the fifth transistor 135 is electrically connected to the other of the source and the drain of the third transistor 133, the one of the source and the drain of the eighth transistor 138, the one of the source and the drain of the tenth transistor 140, and the one of the source and the drain of the twelfth transistor 146.

The gate of the sixth transistor 136 is electrically connected to the word line WL and the gate of the first transistor 131. The one of the source and the drain of the sixth transistor 136 is electrically connected to the gate of the second transistor 132, the gate of the third transistor 133, the one of the source and the drain of the fourth transistor 134, the one of the source and the drain of the fifth transistor 135, and the gate of the eighth transistor 138. The other of the source and the drain of the sixth transistor 136 is electrically connected to a second data line DINBn connected to the memory cell 130_n.

A gate of the seventh transistor 137 is electrically connected to the read line RE and a gate of the ninth transistor 139. One of a source and a drain of the seventh transistor 137 is electrically connected to a first bit line BLn connected to the memory cell 130_n. The other of the source and the drain of the seventh transistor 137 is electrically connected to the other of the source and the drain of the eighth transistor 138.

The gate of the eighth transistor 138 is electrically connected to the gate of the second transistor 132, the gate of the third transistor 133, the one of the source and the drain of the fourth transistor 134, the one of the source and the drain of the fifth transistor 135, and the one of the source and the drain of the sixth transistor 136. The one of the source and the drain of the eighth transistor 138 is electrically connected to the other of the source and the drain of the third transistor 133, the other of the source and the drain of the fifth transistor 135, the one of the source and the drain of the tenth transistor 140, and the one of the source and the drain of the twelfth transistor 146. The other of the source and the drain of the eighth transistor 138 is electrically connected to the other of the source and the drain of the seventh transistor 137. The one of the source and the drain of the eighth transistor 138 may be grounded.

The gate of the ninth transistor 139 is electrically connected to the read line RE and the gate of the seventh transistor 137. One of a source and a drain of the ninth transistor 139 is electrically connected to a second bit line BLNn connected to the memory cell 130_n. The other of the source and the drain of the ninth transistor 139 is electrically connected to the other of the source and the drain of the tenth transistor 140.

The gate of the tenth transistor 140 is electrically connected to the other of the source and the drain of the first transistor 131, the one of the source and the drain of the second transistor 132, the one of the source and the drain of the third transistor 133, the gate of the fourth transistor 134, and the gate of the fifth transistor 135. The one of the source and the drain of the tenth transistor 140 is electrically connected to the other of the source and the drain of the third transistor 133, the other of the source and the drain of the fifth transistor 135, the one of the source and the drain of the eighth transistor 138, and the one of the source and the drain of the twelfth transistor 146. The other of the source and the drain of the tenth transistor 140 is electrically connected to the other of the source and the drain of the ninth transistor 139. The one of the source and the drain of the tenth transistor 140 may be grounded.

A gate of the eleventh transistor 145 is electrically connected to the third data line VData. The one of the source and the drain of the eleventh transistor 145 is electrically connected to the other of the source and the drain of the second transistor 132 and the other of the source and the drain of the fourth transistor 134. The other of the source and the drain of the eleventh transistor 145 is supplied with the high-level power supply potential VDD.

A gate of the twelfth transistor 146 is electrically connected to the fourth data line VDatab. The one of the source and the drain of the twelfth transistor 146 is electrically connected to the other of the source and the drain of the third transistor 133, the other of the source and the drain of the fifth transistor 135, the one of the source and the drain of the eighth transistor 138, and the one of the source and the drain of the tenth transistor 140. The other of the source and the drain of the twelfth transistor 146 is supplied with the ground potential GND as the low-level power supply potential VSS.

In the memory cell 130_n illustrated in FIG. 1, the second transistor 132, which is a p-channel transistor, and the third transistor 133, which is an n-channel transistor, are included in a first inverter 151. The fourth transistor 134, which is a p-channel transistor, and the fifth transistor 135, which is an n-channel transistor, are included in a second inverter 152. FIG. 2 is a circuit diagram where the first inverter 151 and the second inverter 152 are denoted by circuit symbols.

In FIGS. 1 and 2, the gate of the second transistor 132 and the gate of the third transistor 133 (collectively referred to as an input terminal of the first inverter 151), and the one of the source and the drain of the fourth transistor 134 and the one of the source and the drain of the fifth transistor 135 (collectively referred to as an output terminal of the second inverter 152) are electrically connected to a node M3. The one of the source and the drain of the second transistor 132 and the one of the source and the drain of the third transistor 133 (collectively referred to as an output terminal of the first inverter 151), and the gate of the fourth transistor 134 and the gate of the fifth transistor 135 (collectively referred to as an input terminal of the second inverter 152) are electrically connected to a node M4.

The first inverter 151 and the second inverter 152 are included in a data storage circuit 153. The output terminal of the first inverter 151 is electrically connected to the input terminal of the second inverter 152. The output terminal of the second inverter 152 is electrically connected to the input terminal of the first inverter 151. Data input to the memory cell 130_n of the tag 302 or the data field 303 is stored in the data storage circuit 153.

Note that although the eleventh transistor 145 and the twelfth transistor 146 are provided so as to be connected to the memory cell 130_n in FIG. 1, both of the eleventh transistor 145 and the twelfth transistor 146 are not necessary; that is, at least one of them is provided.

<Operation of Cache Line>

Hereinafter, a description will be given of the operation of a cache line 305 (see FIG. 3) which includes the valid bit 301 including the memory cell 100, the tag 302 including memory cells 130_1 to 130_i, and the data field 303 including memory cells 130_j to 130_m (note that i, j, and m are natural numbers, i is larger than or equal to 2, j is larger than i, and m is larger than or equal to j). Although the case where a cache memory includes eight cache lines 305 each having a 1-bit valid bit 301, a 27-bit tag 302, and a 32-bit data field 303 is described in this embodiment, the number of the bits is not limited thereto. It is needless to say that a necessary number of memory cells are included in the valid bit 301, the tag 302, and the data field 303. Further, a necessary number of cache lines 305 are used.

When the tag 302 is a 27-bit tag, i is 27 and the tag 302 includes memory cells 130_1 to 130_27. When the data field 303 is a 32-bit data field, j is 28 and m is 59; in other words, the data field 303 includes memory cells 130_28 to 130_59.

<Operation in Valid Bit>

The operations of writing and reading data to/from the memory cell 100 of the valid bit 301 will be described below.

<<Writing Operation>>

When the word line WL of a given cache line 305 is selected so that the potential WL of the word line WL becomes the high-level potential VH (also referred to as data "1"), the first transistor 101 and the sixth transistor 106 are turned on.

At this time, the potential DIN which is the high-level potential VH (also referred to as data "1") is supplied to the first data line DIN, and the potential DINB which is the low-level potential VL (also referred to as data "0") is supplied to the second data line DINB.

When the high-level potential VH is supplied to the first data line DIN, a potential corresponding to the high-level potential VH is supplied to the node M2 through the source and the drain of the first transistor 101.

When the low-level potential VL is supplied to the second data line DINB, the low-level potential VL (data "0") is supplied to the node M1 through the source and the drain of the sixth transistor 106. In other words, the ground potential GND is supplied to the input terminal of the first inverter 121.

When the low-level potential VL is supplied to the node M1, the potential VData of the third data line VData becomes a low-level potential VL (data "0").

Further, when the low-level potential VL (the ground potential GND in this embodiment) is supplied to the node M1, the second transistor 102 is turned on and the third transistor 103 is turned off.

When the second transistor 102 is turned on and the third transistor 103 is turned off, the high-level power supply potential VDD is supplied to the node M2 through the source and the drain of the second transistor 102. In other words, the high-level potential VH (data "1") is output from the output terminal of the first inverter 121, and the high-level potential VH (data "1") is input to the input terminal of the second inverter 122.

When the high-level potential VH (the high-level power supply potential VDD in this embodiment) is supplied to the node M2, the potential VDatab of the third data line VDatab becomes the high-level potential VH (data "1").

Further, when the high-level potential VH is supplied to the node M2, the fourth transistor 104 is turned off and the fifth transistor 105 is turned on, so that the ground potential GND is supplied to the node M1 through the source and the drain of the fifth transistor 105. In other words, the low-level potential VL (data "0") is output from the output terminal of the second inverter 122, and the low-level potential VL (data "0") is input to the input terminal of the first inverter 121.

Note that in this embodiment, when the potential VData is the low-level potential VL (data "0") and the potential VDatab is the high-level potential VH (data "1"), valid data is "1"; when the potential VData is the high-level potential VH (data "1") and the potential VDatab is the low-level potential VL (data "0"), valid data is "0".

Through the above operation, valid data is written to the memory cell 100 of the valid bit 301. The valid data is stored in the data storage circuit 123 including the first inverter 121 and the second inverter 122.

When the potential VData output from the valid bit 301 is the low-level potential VL (data "0") and the potential VDatab output from the valid bit 301 is the high-level potential VH (data "1") (when valid data is data "1"), data stored in the cache line 305 including the valid bit 301 is valid.

The potential VData which is the low-level potential VL (data "0") is supplied to the gate of the eleventh transistor 145. The potential VDatab which is the high-level potential VH (data "1") is supplied to the gate of the twelfth transistor 146.

As described above, the eleventh transistor 145 and the twelfth transistor 146 are a p-channel transistor and an n-channel transistor, respectively. Thus, when the low-level potential VL (data "0") is supplied to the gate of the eleventh transistor 145, the eleventh transistor 145 is turned on, and when the high-level potential VH (data "1") is supplied to the gate of the twelfth transistor 146, the twelfth transistor 146 is turned on. Accordingly, the high-level power supply potential VDD and the ground potential GND are supplied through the eleventh transistor 145 and the twelfth transistor 146, respectively, to the given memory cell 130_n of the tag 302 or the data field 303, so that the memory cell 130_n is turned on.

Figure 3:
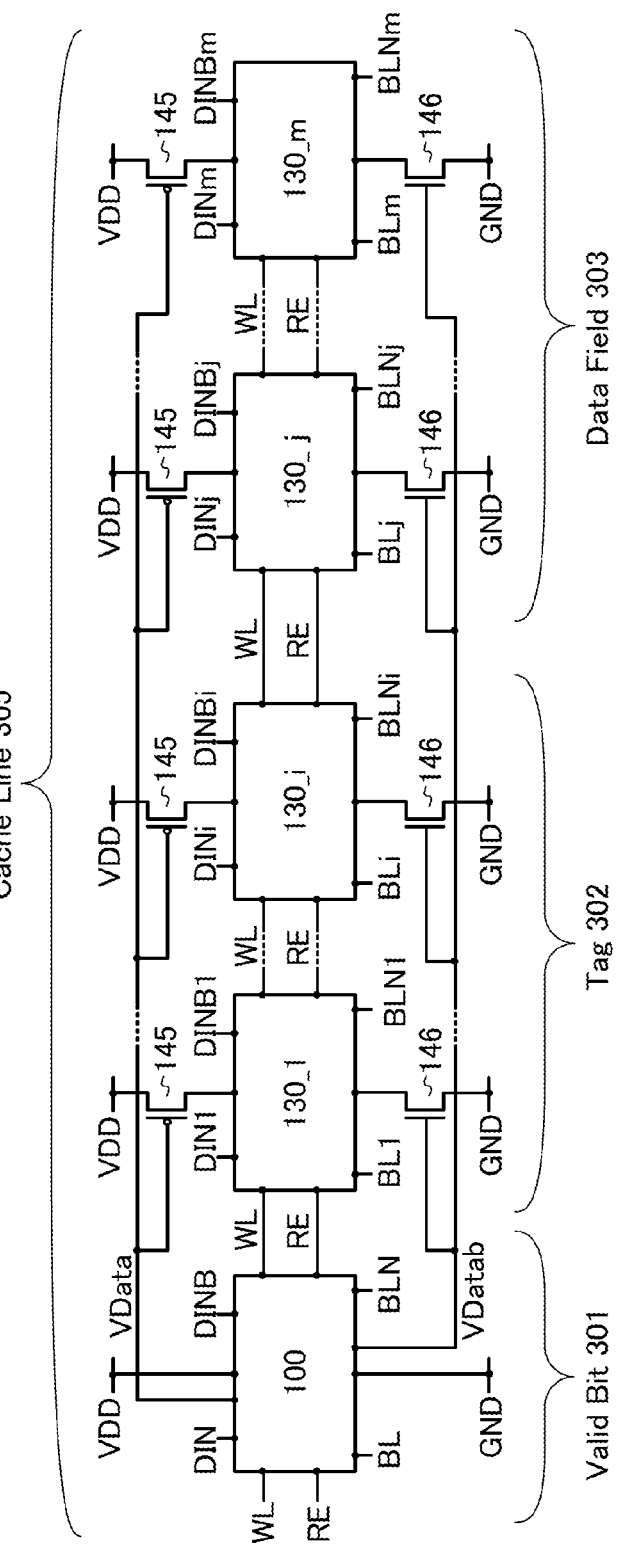
FIG. 3 is a block diagram of a storage device.

As illustrated in FIG. 3, the tag 302 includes the memory cells 130_1 to 130_i, and the data field 303 includes the memory cells 130_j to 130_m. The memory cells 130_1 to 130_m each having a configuration similar to that of the memory cells 130_n are sequentially connected.

As illustrated in FIG. 3, the third data line VData is electrically connected to the eleventh transistors 145 electrically connected to the memory cells of the tag 302 and the data field 303, and the fourth data line VDatab is electrically connected to the twelfth transistors 146 electrically connected to the memory cells of the tag 302 and the data field 303. Thus, when the potential VData is the low-level potential VL (data "0") and the potential VDatab is the high-level potential VH (data "1") (when valid data is data "1"), all the memory cells 130_2 to 130_m of the corresponding cache line 305 are turned on.

On the other hand, when the potential VData output from the valid bit 301 of the cache line 305 is the high-level potential VH (data "1") and the potential VDatab output from the valid bit 301 is the low-level potential VL (data "0") (when valid data is data "0"), data stored in the corresponding cache line 305 is invalid.

The potential VData which is the high-level potential VH (data "1") is supplied to the gates of the eleventh transistors 145 electrically connected to the memory cells 130_1 to 130_i of the tag 302 and the memory cells 130_j to 130_m of the data field 303. The potential VDatab which is the low-level potential VL (data "0") is supplied to the gates of the twelfth transistors 146 electrically connected to the memory cells 130_1 to 130_i of the tag 302 and the memory cells 130_j to 130_m of the data field 303.

As described above, the eleventh transistor 145 and the twelfth transistor 146 are a p-channel transistor and an n-channel transistor, respectively. Thus, when the high-level potential VH (data "1") is supplied to the gate of the eleventh transistor 145, the eleventh transistor 145 is turned off, and when the low-level potential VL (data "0") is supplied to the gate of the twelfth transistor 146, the twelfth transistor 146 is turned off. Accordingly, the high-level power supply potential VDD is not supplied to the memory cells 130_1 to 130_i of the tag 302 and the memory cells 130_j to 130_m of the data field 303. At the same time, the ground potential GND is not supplied to the memory cells 130_1 to 130_i of the tag 302 and the memory cells 130_j to 130_m of the data field 303. Consequently, the memory cells 130_1 to 130_m are turned off.

That is to say, power is not supplied to all the memory cells 130_1 to 130_m in the cache line 305 where the potential VData output from the valid bit 301 is the high-level potential (data "1") and the potential VDatab output from the valid bit 301 is the low-level potential (data "0") (valid data is "0"). Since power is not supplied to the cache line 305 where valid data is "0", low power consumption of the cache memory can be achieved.

Here, Table 1 shows a configuration example of the cache memory of this embodiment which includes eight cache lines 305 each including the 1-bit valid bit 301, the 27-bit tag 302, and the 32-bit data field 303. Note that data stored in the data field 303 shown in Table 1 is only an example and one embodiment of the present invention is not limited thereto.

TABLE 1

| Cache Line 305 | Valid Bit 301 | Tag 302 (27 bit) | Data Field 303 (32 bit) |
|---|---|---|---|
| 0 | 0b | | |
| 1 | 0b | | |
| 2 | 1b | 000010000000010000110000000b | 00001000100000001000000100001001b |
| 3 | 1b | 001001001001000000100000100b | 01001000100001001100010000001001b |
| 4 | 1b | 010000000100000000000000000b | 01000101100010011001000100100101b |
| 5 | 0b | | |
| 6 | 0b | | |
| 7 | 0b | | |

Note that "b" in Table 1 means that data is expressed in binary notation.

As shown in Table 1, data stored in the data fields in cache lines 2 to 4 where valid data of valid bits is "1" are valid. On the other hand, power supply potentials (the high-level power supply potential VDD and the ground potential GND) are not supplied to cache lines 0, 1, and 5 to 7 where valid data is "0". Power supply potentials are not supplied to the cache lines where valid data is "0", whereby low power consumption of the cache memory can be achieved.

<<Reading Operation>>

The operation of reading data stored in the data storage circuit 123 in the memory cell 100 will be described below.

In this embodiment, when valid data stored in the valid bit 301 is "1", data stored in the corresponding data field in the cache line 305 is valid, whereas when valid data stored in the valid bit 301 is "0", data stored in the corresponding data field in the cache line 305 is invalid. A CPU needs to read valid data stored in the valid bit in some cases so that whether data stored in the data field in the cache line is valid or invalid is determined.

Note that a precharge operation for the first bit line BL and the second bit line BLN is performed in a step prior to the operation of reading data from the memory cell 100. For example, the high-level potential VH (data "1") is supplied to the first bit line BL and the second bit line BLN by a precharge circuit (not illustrated) connected to the first bit line BL and the second bit line BLN and then the first bit line BL and the second bit line BLN are made to be electrically floating (in a floating state).

Next, the high-level potential VH is supplied to the read line RE, so that the seventh transistor 107 and the ninth transistor 109 are turned on.

When the low-level potential VL (data "0") and the high-level potential VH (data "1") are held at the node M1 and the node M2, respectively, the low-level potential VL (data "0") is supplied to the gate of the eighth transistor 108, so that the eight transistor 108 is turned off. Further, the high-level potential VH (data "1") is supplied to the gate of the tenth transistor 110, so that the tenth transistor 110 is turned on.

Although the seventh transistor 107 is on, the eighth transistor 108 is off; thus, the potential of the first bit line BL remains the high-level potential VH (data "1") precharged.

Since the tenth transistor 110 is turned on, the ground potential GND is supplied to the second bit line BLN through the ninth transistor 109 and the tenth transistor 110. Consequently, the potential BLN of the second bit line BLN becomes the low-level potential VL (data "0").

Through the above operations, valid data can be read from the valid bit 301.

<Operations of Tag and Data Field>

The operations of writing and reading data to/from the given memory cell 130_n of the memory cells included in the tag 302 and the data field 303 when the valid data is "1" will be given below.

In the memory cell 130_n to which data is written, the potential VData which is the low-level potential VL (data "0") is supplied to the gate of the eleventh transistor 145 to turn on the eleventh transistor 145 in advance. Further, the potential VDatab which is the high-level potential VH (data "1") is supplied to the gate of the twelfth transistor 146 to turn on the twelfth transistor 146 in advance. Accordingly, the high-level power supply potential VDD and the ground potential GND are supplied through the eleventh transistor 145 and the twelfth transistor 146, respectively, to the memory cell 130_n, so that the memory cell 130_n is turned on.

<<Writing Operation>>

The operation of writing data to the given memory cell 130_n which is on (supplied with power) of the tag 302 or the data field 303 in the cache line 305 (the memory cell 130_n in which the eleventh transistor 145 and the twelfth transistor 146 are on) will be described below.

When the potential WL which is the high-level potential VH is supplied to the word line WL in the memory cell 130_n which is on as described above, the first transistor 131 and the sixth transistor 136 are turned on.

At this time, a potential DINn which is the high-level potential VH (data "1") is supplied to the first data line DINn, and a potential DINBn which is the low-level potential VL (data "0") is supplied to the second data line DINBn.

When the high-level potential VH is supplied to the first data line DINn, a potential corresponding to the high-level potential VH is supplied to the gate of the fourth transistor 134 and the gate of the fifth transistor 135 through the source and the drain of the first transistor 131. In other words, a potential corresponding to the high-level potential VH is supplied to the input terminal of the second inverter 152.

When the low-level potential VL is supplied to the second data line DINBn, the low-level potential VL (data "0") is supplied to the node M3 through the source and the drain of the sixth transistor 136. In other words, the ground potential GND is supplied to the input terminal of the first inverter 151.

Since the low-level potential VL is supplied to the node M3, the second transistor 132 is turned on and the third transistor 133 is turned off.

Thus, the high-level power supply potential VDD is supplied to the node M4 through the second transistor 132. In other words, the high-level potential VH (data "1") is output from the output terminal of the first inverter 151.

Through the above steps, address data is written to the given memory cell 130_n of the tag 302 or cache data is written to the given memory cell 130_n of the data field 303. The address data or the cache data is stored in the data storage circuit 153 including the first inverter 151 and the second inverter 152.

<<Reading Operation>>

The operation of reading data stored in the data storage circuit 153 in the memory cell 130_n will be described below. Note that a precharge operation for the first bit line BLn and the second bit line BLNn is performed in a step prior to the reading operation as in the memory cell 100. By the precharge operation, the high-level potential VH (data "1") is supplied to the first bit line BLn and the second bit line BLNn.

The high-level potential VH is supplied to the read line RE, whereby the seventh transistor 137 and the ninth transistor 139 are turned on.

When the low-level potential VL (data "0") is held at the node M3 and the high-level potential VH (data "1") is held at the node M4, the low-level potential VL is supplied to the gate of the eighth transistor 138, so that the eighth transistor 138 is turned off. Further, the high-level potential VH is supplied to the gate of the tenth transistor 140, so that the tenth transistor 140 is turned on.

Even when the seventh transistor 137 is on, the eighth transistor 138 is off; thus, the potential held at the first bit line BLn remains the high-level potential VH precharged.

Since the high-level potential VH (data "1") is held at the node M4, the tenth transistor 140 is on. Accordingly, the ground potential GND is supplied to the second bit line BLNn through the ninth transistor 139 and the tenth transistor 140, so that a potential BLNn becomes the low-level potential VL (data "0").

Note that in this embodiment, when a potential BLn is the high-level potential VH (data "1") and the potential BLNn is the low-level potential VL (data "0"), the data of the memory cell 130_n is "1". When the potential BLn is the low-level potential VL (data "0") and the potential BLNn is the high-level potential VH (data "1"), the data of the memory cell 130_n is "0".

Through the above steps, the address data and the cache data can be read from the tag 302 and the data field 303, respectively.

Figure 4:
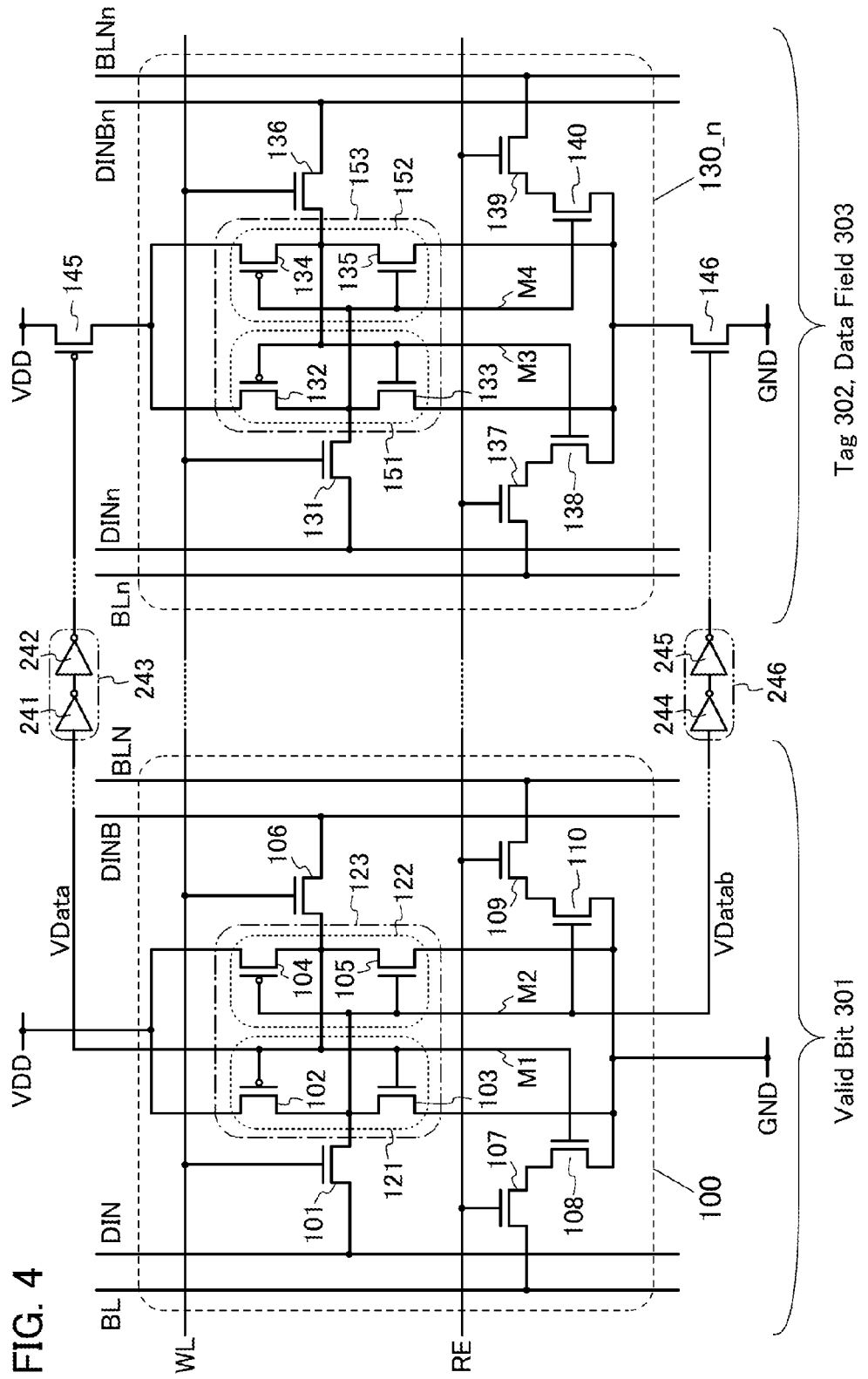
FIG. 4 is a circuit diagram of a storage device.

Note that the third data line VData and the fourth data line VDatab may each be provided with a buffer circuit. FIG. 4 illustrates a circuit configuration example different from that in FIG. 1 in that the third data line VData and the fourth data line VDatab are provided with a buffer circuit 243 and a buffer circuit 246, respectively.

The buffer circuit 243 includes two inverters (an inverter 241 and an inverter 242) connected in series. The buffer circuit 246 includes two inverters (an inverter 244 and an inverter 245) connected in series. Although the buffer circuit 243 and the buffer circuit 246 in FIG. 4 each includes two inverters, the number of inverters is any number as long as it is an even number larger than or equal to two.

The buffer circuit 243 is electrically connected between the node M1 of the memory cell 100 and the gate of the eleventh transistor 145 of the memory cell 130_n. The buffer circuit 246 is electrically connected between the node M2 of the memory cell 100 and the gate of the twelfth transistor 146 of the memory cell 130_n.

When the third data line VData and the fourth data line VDatab are provided with the buffer circuits as described above, they can have more excellent output characteristics.

Thus, according to this embodiment, low power consumption of the storage device can be achieved.

Embodiment 2

In this embodiment, the circuit configuration of a storage device having a configuration different from that of Embodiment 1 will be described. Note that the same components as those described in Embodiment 1 will be described using common reference numerals and the descriptions thereof will be omitted.

<Configuration of Valid Bit>

In this embodiment, the configuration in which a memory cell of the valid bit 301 additionally has a reset function will be described.

Figure 5:
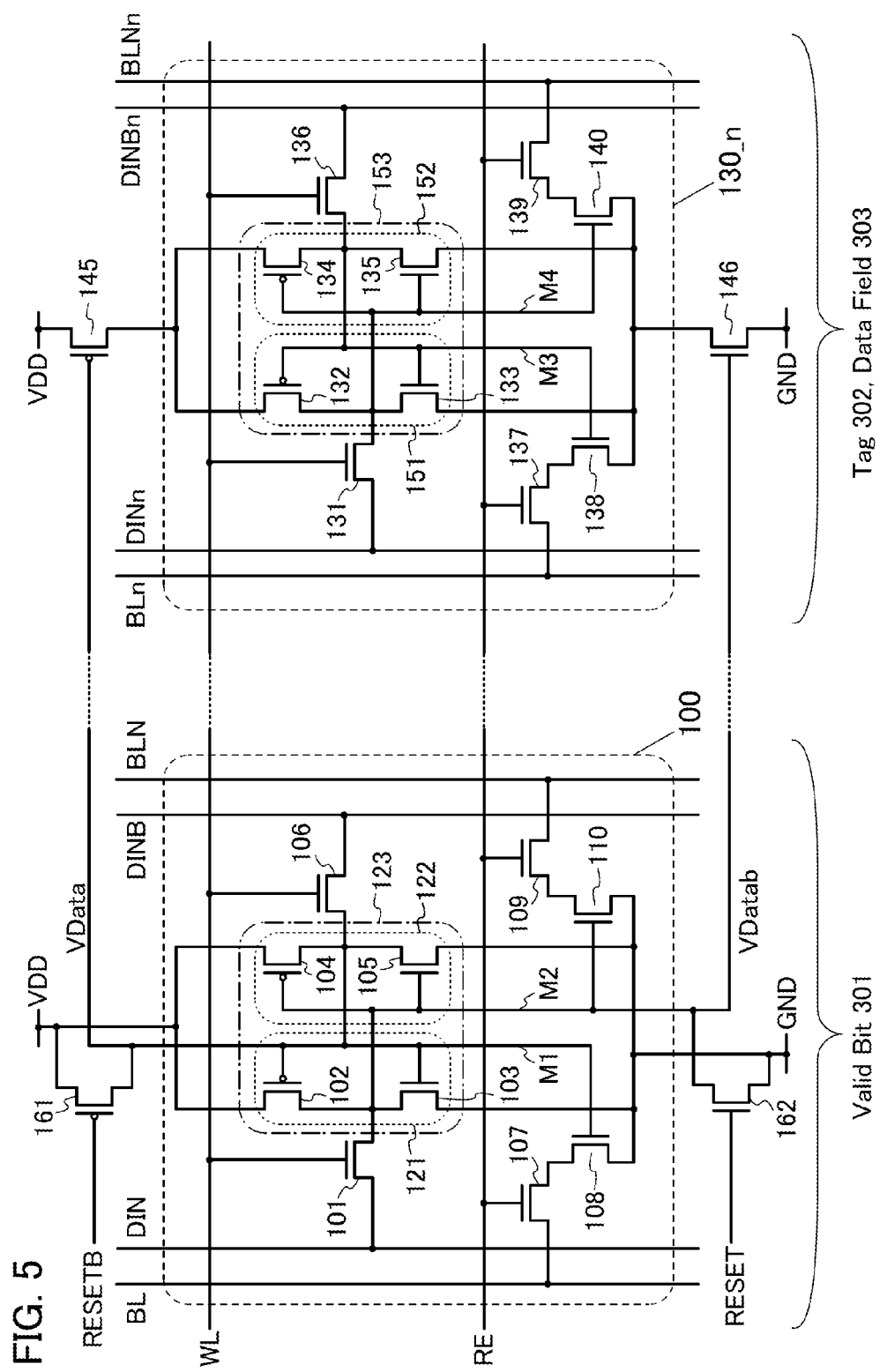
FIG. 5 is a circuit diagram of a storage device.

To the memory cell 100 of the valid bit 301 in FIG. 5, a thirteenth transistor 161 which is a p-channel transistor and a fourteenth transistor 162 which is an n-channel transistor are electrically connected.

To a gate of the thirteenth transistor 161, a second reset line RESTB is electrically connected and a potential RESTB of the second reset line RESTB is supplied. The other of a source and a drain of the thirteenth transistor 161 is supplied with the high-level power supply potential VDD. The other of the source and the drain of the thirteenth transistor 161 is electrically connected to the third data line VData, a gate of the second transistor 102, a gate of the third transistor 103, one of a source and a drain of the fourth transistor 104, one of a source and a drain of the fifth transistor 105, one of a source and a drain of the sixth transistor 106, and a gate of the eighth transistor 108.

To a gate of the fourteenth transistor 162, a first reset line REST is electrically connected and a potential REST of the first reset line REST is supplied. One of a source and a drain of the fourteenth transistor 162 is supplied with the ground potential GND. The other of the source and the drain of the fourteenth transistor 162 is electrically connected to the fourth data line VDatab, the other of a source and a drain of the first transistor 101, one of a source and a drain of the second transistor 102, one of a source and a drain of the third transistor 103, a gate of the fourth transistor 104, a gate of the fifth transistor 105, and a gate of the tenth transistor 110.

Further, different potentials selected from the high-level potential VH and the low-level potential VL are supplied to the first reset line REST and the second reset line RESTB. Specifically, when the potential REST is the high-level potential VH, the potential RESTB is the low-level potential VL, and when the potential REST is the low-level potential VL, the potential RESTB is the high-level potential VH.

Figure 6:
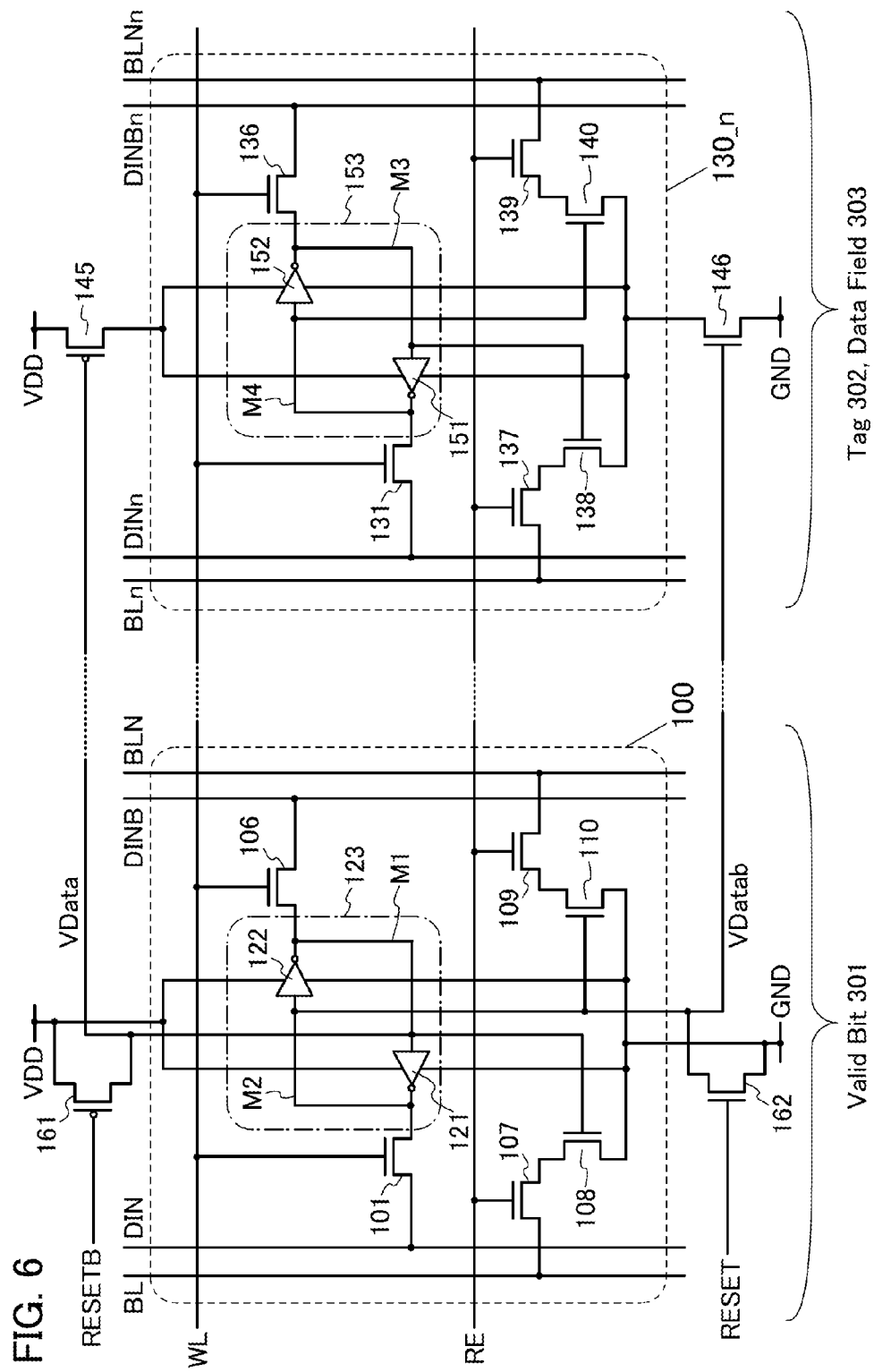
FIG. 6 is a circuit diagram of a storage device.

As described in Embodiment 1, the first inverter 121 includes the second transistor 102 and the third transistor 103, and the second inverter 122 includes the fourth transistor 104 and the fifth transistor 105. The data storage circuit 123 includes the first inverter 121 and the second inverter 122 (see FIG. 6).

<Operation in Valid Bit>

As soon as the power is supplied to a cache memory illustrated in FIG. 5, data of a cache line becomes invalid. Further, in the valid bit directly after the power supply, the potential of the node M1 (an output terminal of the second inverter 122) and the potential of the node M2 (an output terminal of the first inverter 121) can be either the high-level potential VH (data "1") or the low-level potential VL (data "0"). That is, valid data of the cache line having invalid data could be "1". When a CPU reads and processes data of invalid data of the cache line, the CPU might malfunction.

For this reason, valid data "0" of the valid bit 301 needs to be written as soon as the power is supplied to the cache memory illustrated in FIG. 5. As described above, valid data "0" means that the potential VData is the high-level potential VH (data "1") and the potential VDatab is the low-level potential VL (data "0").

When a potential RESET of a first reset line RESET is the high-level potential VH and a potential RESETB of a second reset line RESETB is the low-level potential VL, the thirteenth transistor 161 and the fourteenth transistor 162 are turned on.

When the thirteenth transistor 161 is turned on, the potential VData of the third data line VData becomes the high-level power supply potential VDD (data "1") through the thirteenth transistor 161.

When the fourteenth transistor 162 is turned on, the potential VDatab of the fourth data line VDatab becomes the ground potential GND (data "0") through the fourteenth transistor 162.

By thus writing "0" as valid data, invalid data of the cache line can be prevented from being used.

Note that the third data line VData and the fourth data line VDatab may each be provided with a buffer circuit as in Embodiment 1.

According to this embodiment, low power consumption of the storage device can be achieved.

Embodiment 3

In this embodiment, the circuit configuration of a storage device having a configuration different from those of Embodiment 1 and Embodiment 2 will be described. Note that the same components as those described in Embodiment 1 and Embodiment 2 will be described using common reference numerals and the descriptions thereof will be omitted.

<Configuration of Valid Bit>

Figure 7:
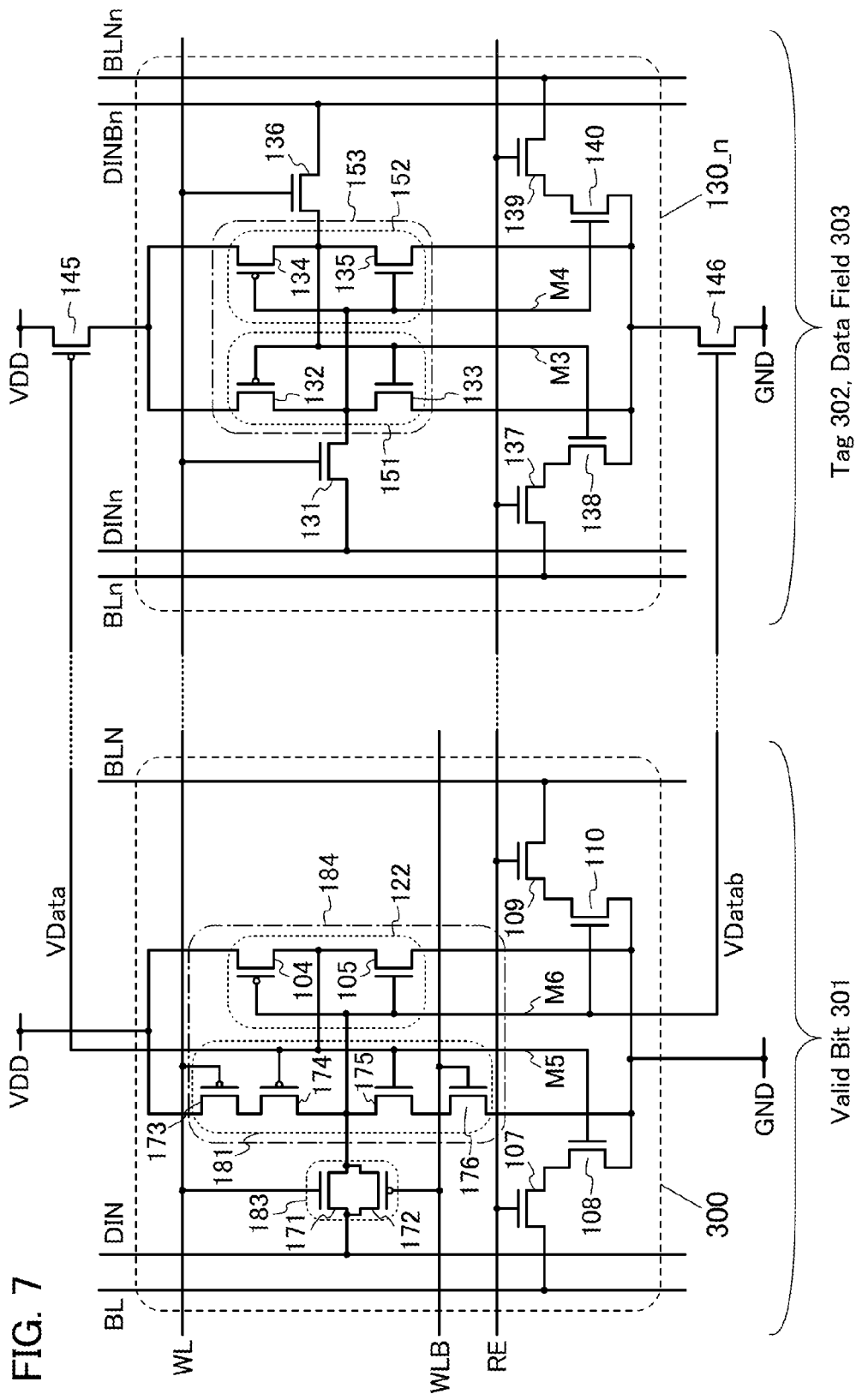
FIG. 7 is a circuit diagram of a storage device.
Figure 8:
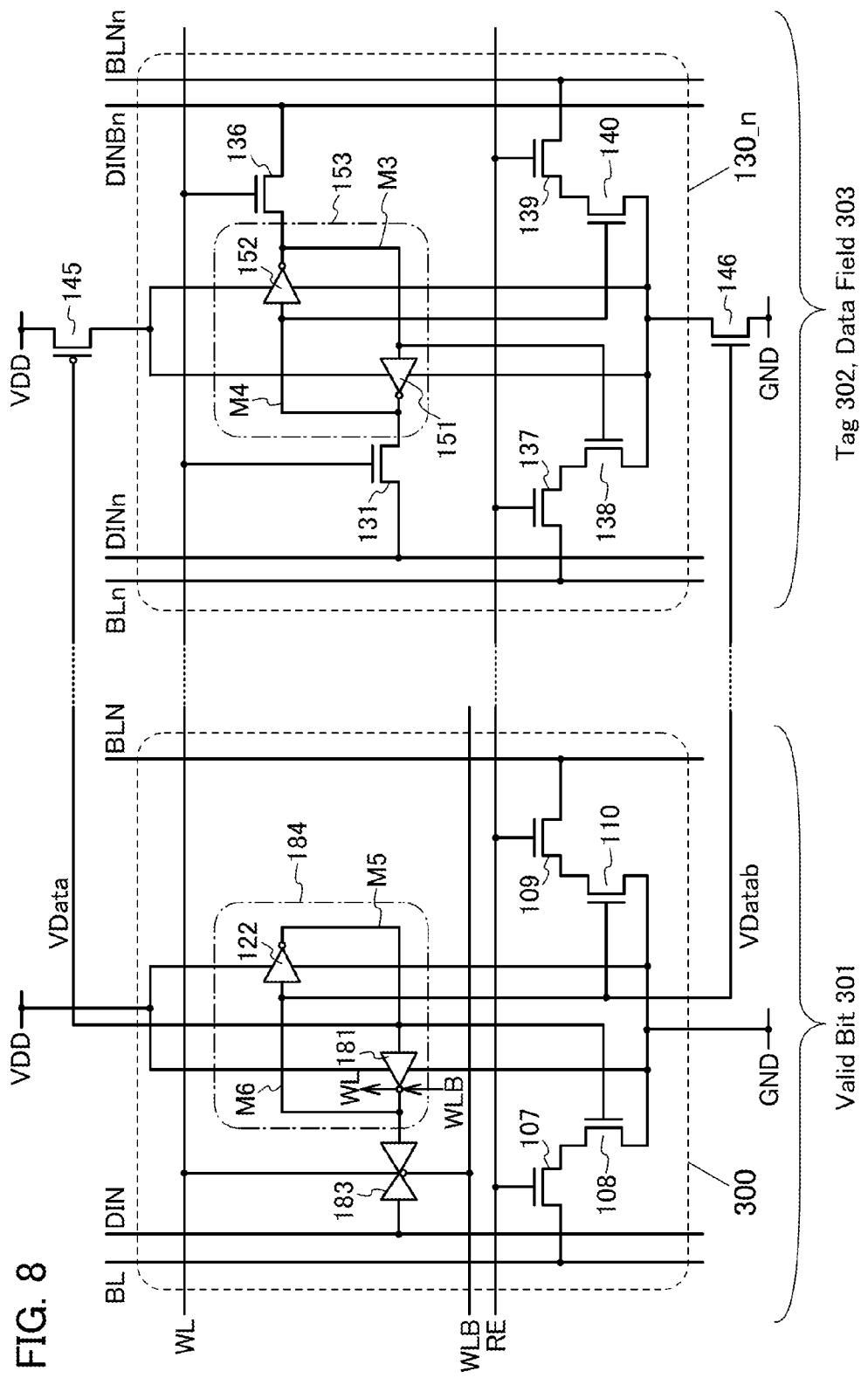
FIG. 8 is a circuit diagram of a storage device.

In a memory cell 300 of the valid bit 301 illustrated in FIGS. 7 and 8, a clocked inverter and an analog switch are used instead of the first inverter 121 and the first transistor 101 in the memory cell 100 in FIG. 1, respectively.

In this embodiment, when the analog switch of the memory cell is on, the clocked inverter is off. When the analog switch of the memory cell is off, the clocked inverter is on. With such a configuration, data conflict in data writing can be prevented. The details will be described later.

The memory cell 300 in FIGS. 7 and 8 includes an analog switch 183, a data storage circuit 184, the seventh transistor 107, the eighth transistor 108, the ninth transistor 109, and the tenth transistor 110. Note that the analog switch is also referred to as a transmission gate. FIG. 8 is a circuit diagram where the analog switch 183, the clocked inverter 181, and the second inverter 122 illustrated in FIG. 7 are denoted by circuit symbols.

In the memory cell 300 illustrated in FIGS. 7 and 8, a first word line WL and a second word line WLB are electrically connected to each other. Note that a potential supplied to the first word line WL is referred to as the potential WL, and a potential supplied to the second word line WLB is referred to as a potential WLB.

Further, different potentials selected from the high-level potential VH and the low-level potential VL are supplied to the first word line WL and the second word line WLB. Specifically, when the potential WL is the high-level potential VH, the potential VLB is the low-level potential VL, and when the potential WL is the low-level potential VL, the potential WLB is the high-level potential VH.

The analog switch 183 includes a fifteenth transistor 171 which is an n-channel transistor and a sixteenth transistor 172 which is a p-channel transistor.

The data storage circuit 184 includes the clocked inverter 181 and the second inverter 122.

The clocked inverter 181 includes a seventeenth transistor 173 and an eighteenth transistor 174 which are p-channel transistors and a nineteenth transistor 175 and a twentieth transistor 176 which are n-channel transistors.

The second inverter 122 includes the fourth transistor 104 which is a p-channel transistor and the fifth transistor 105 which is an n-channel transistor as in Embodiment 1.

A gate of the fifteenth transistor 171 is electrically connected to the first word line WL and a gate of the seventeenth transistor 173. One of a source and a drain of the fifteenth transistor 171 is electrically connected to the first data line DIN and one of a source and a drain of the sixteenth transistor 172. The other of the source and the drain of the fifteenth transistor 171 is electrically connected to the fourth data line VDatab, the other of the source and the drain of the sixteenth transistor 172, one of a source and a drain of the eighteenth transistor 174, one of a source and a drain of the nineteenth transistor 175, a gate of the fourth transistor 104, a gate of the fifth transistor 105, and a gate of the tenth transistor 110.

A gate of the sixteenth transistor 172 is electrically connected to the second word line WLB and a gate of the twentieth transistor 176. The one of the source and the drain of the sixteenth transistor 172 is electrically connected to the first data line DIN and the one of the source and the drain of the fifteenth transistor 171. The other of the source and the drain of the sixteenth transistor 172 is electrically connected to the fourth data line VDatab, the other of the source and the drain of the fifteenth transistor 171, the one of the source and the drain of the eighteenth transistor 174, the one of the source and the drain of the nineteenth transistor 175, the gate of the fourth transistor 104, the gate of the fifth transistor 105, and the gate of the tenth transistor 110.

The gate of the seventeenth transistor 173 is electrically connected to the first word line WL and the gate of the fifteenth transistor 171. One of a source and a drain of the seventeenth transistor 173 is electrically connected to the other of the source and the drain of the eighteenth transistor 174. The other of the source and the drain of the seventeenth transistor 173 is supplied with the high-level power supply potential VDD and electrically connected to the other of a source and a drain of the fourth transistor 104.

A gate of the eighteenth transistor 174 is electrically connected to the third data line VData, a gate of the nineteenth transistor 175, one of the source and the drain of the fourth transistor 104, one of a source and a drain of the fifth transistor 105, and a gate of the eighth transistor 108. The one of the source and the drain of the eighteenth transistor 174 is electrically connected to the fourth data line VDatab, the other of the source and the drain of the fifteenth transistor 171, the other of the source and the drain of the sixteenth transistor 172, the one of the source and the drain of the nineteenth transistor 175, the gate of the fourth transistor 104, the gate of the fifth transistor 105, and the gate of the tenth transistor 110. The other of the source and the drain of the eighteenth transistor 174 is electrically connected to the other of the source and the drain of the seventeenth transistor 173.

The gate of the nineteenth transistor 175 is electrically connected to the third data line VData, the gate of the eighteenth transistor 174, the one of the source and the drain of the fourth transistor 104, the one of the source and the drain of the fifth transistor 105, and the gate of the eighth transistor 108. The one of the source and the drain of the nineteenth transistor 175 is electrically connected to the fourth data line VDatab, the other of the source and the drain of the fifteenth transistor 171, the other of the source and the drain of the sixteenth transistor 172, the one of the source and the drain of the eighteenth transistor 174, the gate of the fourth transistor 104, the gate of the fifth transistor 105, and the gate of the tenth transistor 110. The other of the source and the drain of the nineteenth transistor 175 is electrically connected to one of a source and a drain of the twentieth transistor 176.

The gate of the twentieth transistor 176 is electrically connected to the second word line WLB and the gate of the sixteenth transistor 172. The one of the source and the drain of the twentieth transistor 176 is electrically connected to the other of the source and the drain of the nineteenth transistor 175. The other of the source and the drain of the twentieth transistor 176 is supplied with the ground potential GND and electrically connected to one of a source and a drain of the eighth transistor 108, the other of the source and the drain of the fifth transistor 105, and one of a source and a drain of the tenth transistor 110.

In FIGS. 7 and 8, the gate of the eighteenth transistor 174 and the gate of the nineteenth transistor 175 (collectively referred to as an input terminal of the clocked inverter 181), and the one of the source and the drain of the fourth transistor 104 and the one of the source and the drain of the fifth transistor 105 (collectively referred to as an output terminal of the second inverter 122) are electrically connected to a node M5.

The one of the source and the drain of the eighteenth transistor 174 and the one of the source and the drain of the nineteenth transistor 175 (collectively referred to as an output terminal of the clocked inverter 181), and the gate of the fourth transistor 104 and the gate of the fifth transistor 105 (collectively referred to as an input terminal of the second inverter 122) are electrically connected to a node M6. The potential of the node M5 is the output potential of the second inverter 122 and is the potential VData. The potential of the node M6 is the output potential of the clocked inverter 181 and is the potential VDatab.

<Operation in Valid Bit>

The operation of writing data to the memory cell 300 of the valid bit 301 will be described below with reference of FIGS. 7 and 8.

<<Writing Operation>>

When the potential WL of the first word line WL becomes the high-level potential VH (data "1") and the potential WLB of the second word line WLB becomes the low-level potential VL (data "0"), the fifteenth transistor 171 and the sixteenth transistor 172 are turned on. In other words, the analog switch 183 is turned on.

When the high-level potential VH (data "1") is supplied to the first data line DIN, the high-level potential VH is supplied to the gate of the fourth transistor 104 and the gate of the fifth transistor 105 through the source and the drain of each of the fifteenth transistor 171 and the sixteenth transistor 172. In other words, the high-level potential VH (data "1") is supplied to the input terminal of the second inverter 122.

Consequently, the fourth transistor 104 is turned off and the fifth transistor 105 is turned on.

When the fifth transistor 105 is turned on, the ground potential GND (data "0") is supplied to the node M5 through the source and the drain of the fifth transistor 105. In other words, the ground potential GND (data "0") is output from the output terminal of the second inverter 122.

Since the ground potential GND (data "0") is supplied to the node M5, the potential VData of the third data line VData becomes the ground potential (data "0").

Since the high-level potential VH is supplied to the gate of the fourth transistor 104 and the gate of the fifth transistor 105, the potential of the node M6 becomes the high-level potential VH (data "1"), so that the potential VDatab of the fourth data line VDatab becomes the high-level potential VH (data "1").

On the other hand, the potential WL which is the high-level potential VH is supplied to the gate of the seventeenth transistor 173, so that the seventeenth transistor 173 is turned off. The potential WLB which is the low-level potential VL is supplied to the gate of the twentieth transistor 176, so that the twentieth transistor 176 is turned off. In other words, the clocked inverter 181 is turned off.

As described above, valid data is "1" when the potential VData is the low-level potential VL (data "0") and the potential VDatab is the high-level potential VH (data "1"). Thus, by the writing operation, valid data "1" is written to the memory cell 300 of the valid bit 301.

Through the above operations, in the memory cell 300 of the valid bit 301, the clocked inverter 181 of the data storage circuit 184 is turned off and the analog switch 183 is turned on, so that valid data can be written.

<<Storage Operation>>

The operation of storing valid data written to the memory cell 300 will be described below.

When the potential WL of the first word line WL becomes the low-level potential VL (data "0") and the potential WLB of the second word line WLB becomes the high-level potential VH (data "1"), the fifteenth transistor 171 and the sixteenth transistor 172 are turned off. In other words, the analog switch 183 is turned off.

The potential WL which is the low-level potential VL is supplied to the gate of the seventeenth transistor 173, so that the seventeenth transistor 173 is turned on. The potential WLB which is the high-level potential VH is supplied to the gate of the twentieth transistor 176, so that the twentieth transistor 176 is turned on.

In the writing operation, the ground potential GND (data "0") is supplied to the node M5. That is, the ground potential GND (data "0") is supplied to the gate of the eighteenth transistor 174. Consequently, the eighteenth transistor 174 is turned on.

Since the ground potential GND (data "0") is supplied to the node M5, the ground potential GND (data "0") is supplied to the gate of the nineteenth transistor 175, so that the nineteenth transistor 175 remains off.

Since the seventeenth transistor 173 and the eighteenth transistor 174 are on, the high-level potential VH (data "1") is supplied to the node M5. The nineteenth transistor 175 and the twentieth transistor 176 are off. In other words, the clocked inverter 181 outputs the high-level potential VH (data "1").

In the storage operation, the high-level potential VH (data "1") is input to the second inverter 122 and the ground potential GND (data "0") is output from the second inverter 122, so that the high-level potential VH (data "1") is held at the node M6.

Thus, the potential VData is the ground potential GND (data "0") and the potential VDatab is the high-level potential VH (data "1").

As described above, valid data is "1" when the potential VData is the low-level potential VL (data "0") and the potential VDatab is the high-level potential VH (data "1"). Thus, by the storage operation, valid data "1" is held in the memory cell 300 of the valid bit 301.

Through the above operations, in the memory cell 300 of the valid bit 301, the clocked inverter 181 of the data storage circuit 184 is turned on and the analog switch 183 is turned off, so that valid data can be stored.

The state where two or more output terminals are connected to one node, the high-level potential VH is supplied from one of the output terminals, and the low-level potential VL is supplied from one of the other output terminals is referred to as data conflict. In the data storage circuit in Embodiment 1 which includes the first inverter 121 and the second inverter 122 and in which the output terminal of the first inverter 121 is electrically connected to the input terminal of the second inverter 122 and the output terminal of the second inverter 122 is electrically connected to the input terminal of the first inverter 121, data conflict might occur in data rewriting. For example, when the low-level potential VL is supplied from the first data line DIN through the first transistor 101 in the state where the first inverter 121 outputs the high-level potential VH (in the state where the high-level potential VH is supplied to the node M2), the low-level potential VL is supplied to the node M2 supplied with the high-level potential VH.

Data conflict might cause the delay of data rewriting or the loss of data.

In the memory cell 300 exemplified in this embodiment, the clocked inverter 181 is turned off when the analog switch 183 is on, whereby the node M6 can be in the state where a potential is not supplied (in a floating state). The clocked inverter 181 is on when the analog switch 183 of the memory cell 300 is off, whereby a potential is supplied to the node M6. With such a configuration, data conflict in data rewriting can be prevented.

<<Reading Operation>>

To read valid data from the valid bit 301 including the memory cell 300, the data storage circuit 123, the node M1, and the node M2 in the reading operation described in Embodiment 1 are replaced with the data storage circuit 184, the node M5, and the node M6, respectively.

Through the above operations, valid data can be read from the valid bit 301.

A storage device where a clocked inverter and an analog switch are provided in each of memory cells of the tag 302 and the data field 303 as well as in the memory cell of the valid bit illustrated in FIGS. 7 and 8 will be described below. With this configuration, data conflict can be prevented also in the memory cells of the tag 302 and the data field 303.

<Configurations of Tag and Data Field>

Figure 9:
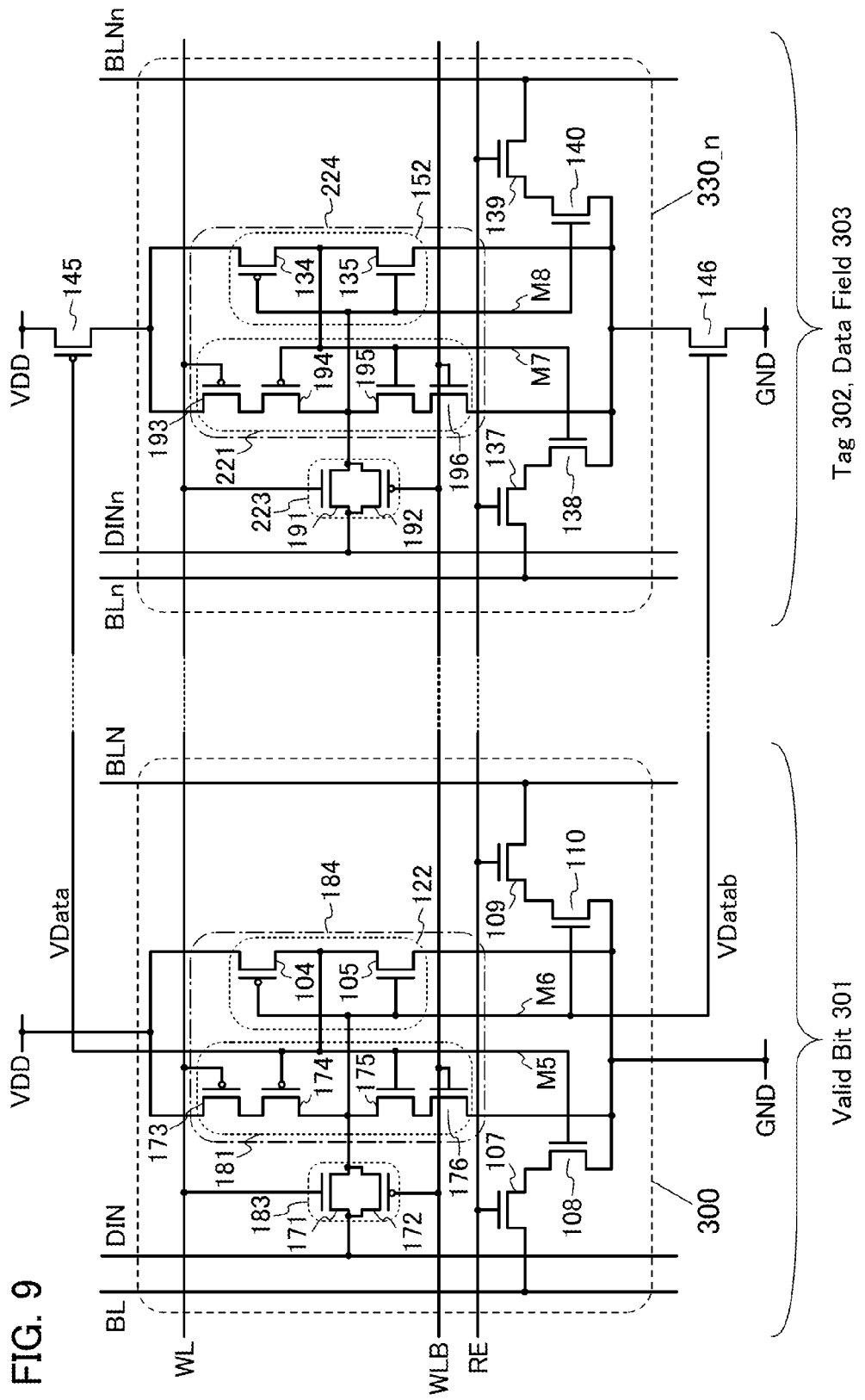
FIG. 9 is a circuit diagram of a storage device.
Figure 10:
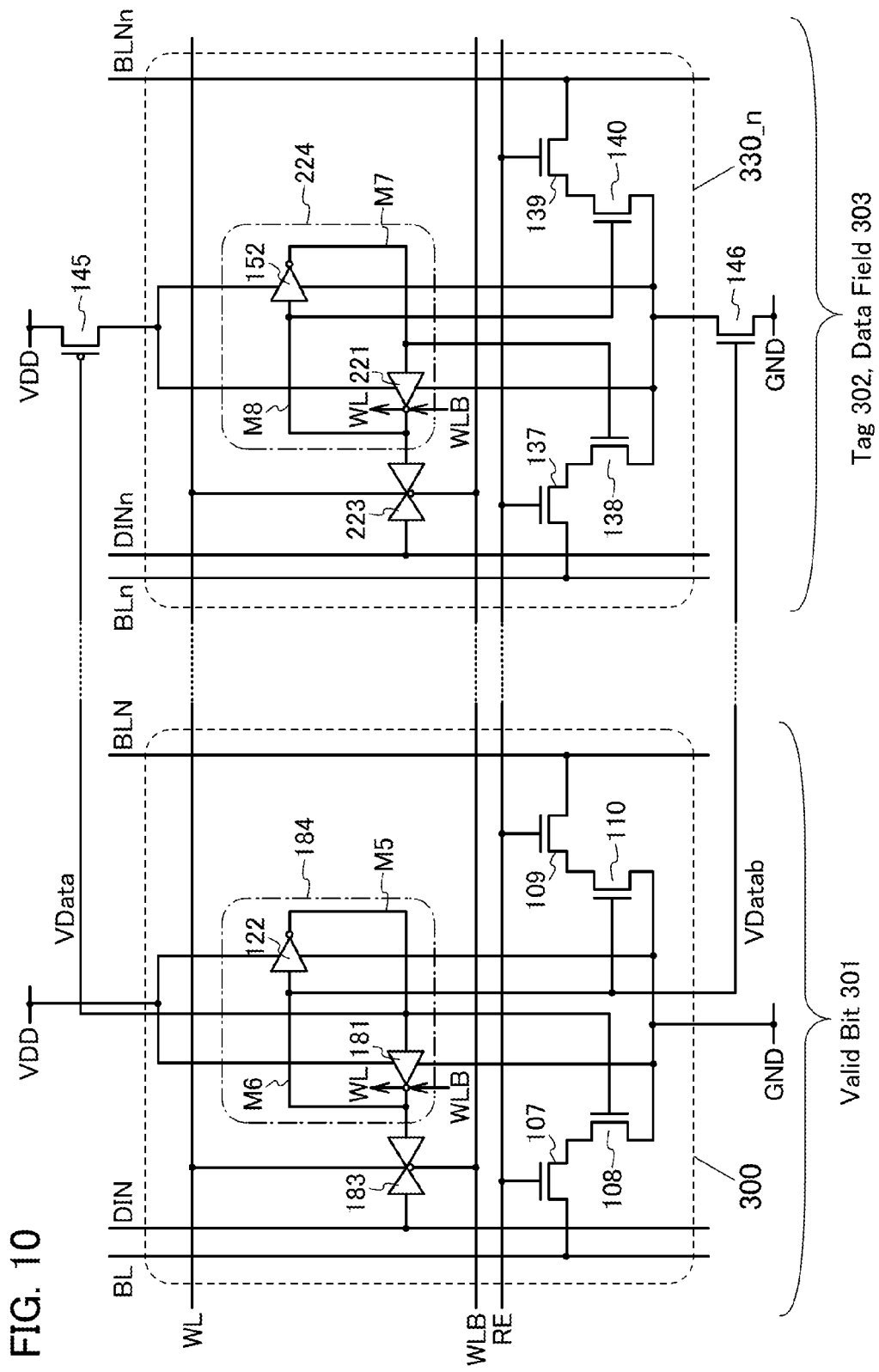
FIG. 10 is a circuit diagram of a storage device.

A given memory cell 330_n of the tag 302 and the data field 303 in FIGS. 9 and 10 includes an analog switch and a clocked inverter instead of the first transistor 131 and the first inverter 151 of the given memory cell 130_*n* of the tag 302 and the data field 303 in FIGS. 7 and 8, respectively.

The memory cell 330_*n* in FIGS. 9 and 10 includes an analog switch 223, a data storage circuit 224, the seventh transistor 137, the eighth transistor 138, the ninth transistor 139, and the tenth transistor 140. The eleventh transistor 145 and the twelfth transistor 146 are electrically connected to the memory cell 330_*n*. FIG. 10 is a circuit diagram where the analog switch 183, the clocked inverter 181, the second inverter 122, the analog switch 223, a clocked inverter 221, and the second inverter 152 illustrated in FIG. 9 are denoted by circuit symbols.

In the memory cell 330_*n* illustrated in FIGS. 9 and 10, the first word line WL and the second word line WLB are electrically connected to each other.

The analog switch 223 includes a fifteenth transistor 191 which is an n-channel transistor and a sixteenth transistor 192 which is a p-channel transistor.

The data storage circuit 224 includes the clocked inverter 221 and the second inverter 152.

The clocked inverter 221 includes a seventeenth transistor 193 and an eighteenth transistor 194 which are p-channel transistors and a nineteenth transistor 195 and a twentieth transistor 196 which are n-channel transistors.

The second inverter 152 includes the fourth transistor 134 which is a p-channel transistor and the fifth transistor 135 which is an n-channel transistor as in Embodiment 1.

A gate of the fifteenth transistor 191 is electrically connected to the first word line WL and a gate of the seventeenth transistor 193. One of a source and a drain of the fifteenth transistor 191 is electrically connected to the first data line DINn and one of a source and a drain of the sixteenth transistor 192. The other of the source and the drain of the fifteenth transistor 191 is electrically connected to the other of the source and the drain of the sixteenth transistor 192, one of a source and a drain of the eighteenth transistor 194, one of a source and a drain of the nineteenth transistor 195, a gate of the fourth transistor 134, a gate of the fifth transistor 135, and a gate of the tenth transistor 140.

A gate of the sixteenth transistor 192 is electrically connected to the second word line WLB and a gate of the twentieth transistor 196. One of a source and a drain of the sixteenth transistor 192 is electrically connected to the first data line DINn and the one of the source and the drain of fifteenth transistor 191. The other of the source and the drain of the sixteenth transistor 192 is electrically connected to the other of the source and the drain of the fifteenth transistor 191, the one of the source and the drain of the eighteenth transistor 194, the one of the source and the drain of the nineteenth transistor 195, the gate of the fourth transistor 134, the gate of the fifth transistor 135, and the gate of the tenth transistor 140.

The gate of the seventeenth transistor 193 is electrically connected to the first word line WL and the gate of the fifteenth transistor 191. One of a source and a drain of the seventeenth transistor 193 is electrically connected to the other of the source and the drain of the eighteenth transistor 194. The other of the source and the drain of the seventeenth transistor 193 is electrically connected to the other of a source and a drain of the fourth transistor 134 and one of a source and a drain of the eleventh transistor 145.

A gate of the eighteenth transistor 194 is electrically connected to a gate of the nineteenth transistor 195, one of the source and the drain of the fourth transistor 134, one of a source and a drain of the fifth transistor 135, and a gate of the eighth transistor 138. The one of the source and the drain of the eighteenth transistor 194 is electrically connected to the other of the source and the drain of the fifteenth transistor 191, the other of the source and the drain of the sixteenth transistor 192, the one of the source and the drain of the nineteenth transistor 195, the gate of the fourth transistor 134, the gate of the fifth transistor 135, and the gate of the tenth transistor 140. The other of the source and the drain of the eighteenth transistor 194 is electrically connected to the one of the source and the drain of the seventeenth transistor 193.

The gate of the nineteenth transistor 195 is electrically connected to the gate of the eighteenth transistor 194, the one of the source and the drain of the fourth transistor 134, the one of the source and the drain of the fifth transistor 135, and the gate of the eighth transistor 138. The one of the source and the drain of the nineteenth transistor 195 is electrically connected to the other of the source and the drain of the fifteenth transistor 191, the other of the source and the drain of the sixteenth transistor 192, the one of the source and the drain of the eighteenth transistor 194, the gate of the fourth transistor 134, the gate of the fifth transistor 135, and the gate of the tenth transistor 140. The other of the source and the drain of the nineteenth transistor 195 is electrically connected to one of a source and a drain of the twentieth transistor 196.

The gate of the twentieth transistor 196 is electrically connected to the second word line WLB and the gate of the sixteenth transistor 192. The one of the source and the drain of the twentieth transistor 196 is electrically connected to the other of the source and the drain of the nineteenth transistor 195. The other of the source and the drain of the twentieth transistor 196 is electrically connected to one of a source and a drain of the eighth transistor 138, one of a source and a drain of the tenth transistor 140, and one of a source and a drain of the twelfth transistor 146.

In FIGS. 9 and 10, the gate of the eighteenth transistor 194 and the gate of the nineteenth transistor 195 (collectively referred to as an input terminal of the clocked inverter 221), and the one of the source and the drain of the fourth transistor 134 and the one of the source and the drain of the fifth transistor 135 (collectively referred to as an output terminal of the second inverter 152) are electrically connected to a node M7.

The one of the source and the drain of the eighteenth transistor 194 and the one of the source and the drain of the nineteenth transistor 195 (collectively referred to as an output terminal of the clocked inverter 221), and the gate of the fourth transistor 134 and the gate of the fifth transistor 135 (collectively referred to as an input terminal of the second inverter 152) are electrically connected to a node M8. The node M7 is supplied with a potential from the second inverter 152, and the node M8 is supplied with a potential from the clocked inverter 221.

Note that although the eleventh transistor 145 and the twelfth transistor 146 are provided so as to be connected to the memory cell 330_*n* in FIGS. 9 and 10, both of the eleventh transistor 145 and the twelfth transistor 146 are not necessary; that is, at least one of them is provided.

<Operations of Tag and Data Field>

The operations of writing and reading data to/from the given memory cells 330_*n* of the memory cells included in the tag 302 and the data field 303 when the valid data is "1" will be given below.

In the memory cell 330_*n* to which data is written, the potential VData which is the low-level potential VL (data "0") is supplied to the gate of the eleventh transistor 145 to turn on the eleventh transistor 145. Further, the potential VDatab which is the high-level potential VH (data "1") is supplied to the gate of the twelfth transistor 146 to turn on the twelfth transistor 146. Accordingly, the high-level power supply potential VDD and the ground potential GND are supplied through the eleventh transistor 145 and the twelfth transistor 146, respectively, to the memory cell 330_*n*.

In the operations of writing and storing data to/in the memory cell 330_*n*, the fifteenth to twentieth transistors 171 to 176, the fourth transistor 104, the fifth transistor 105, the analog switch 183, the clocked inverter 181, the second inverter 122, the node M5, the node M6, and the memory cell 300 in the operation of writing data to the memory cell 300 are replaced with the fifteenth to twentieth transistors 191 to 196, the fourth transistor 134, the fifth transistor 135, the analog switch 223, the clocked inverter 221, the second inverter 152, the node M7, the node M8, and the memory cell 330_*n*, respectively.

Through the above operations, the address data and the cache data can be written to the tag 302 and the data field 303, respectively, and the written data can be stored.

To read the address data and the cache data from the tag 302 and the data field 303 of this embodiment, respectively, the memory cell 130_*n*, the data storage circuit 153, the node M3, and the node M4 in the reading operation described in Embodiment 1 are replaced with the memory cell 330_*n*, the data storage circuit 224, the node M7, and the node M8, respectively.

Through the above steps, the address data and the cache data can be read from the tag 302 and the data field 303, respectively.

Note that the precharge operation described in Embodiment 1 is performed in a step prior to the operation of reading data from the memory cell 330_*n*. Embodiment 1 can be referred to for the precharge operation; thus, the specific description thereof will be omitted.

Note that the third data line VData and the fourth data line VDatab may each be provided with a buffer circuit as in Embodiment 1.

According to this embodiment, low power consumption of the storage device can be achieved.

Embodiment 4

In this embodiment, a CPU including any of the storage devices described in Embodiments 1 to 3 will be described.
<Configuration of CPU>

Figure 11:
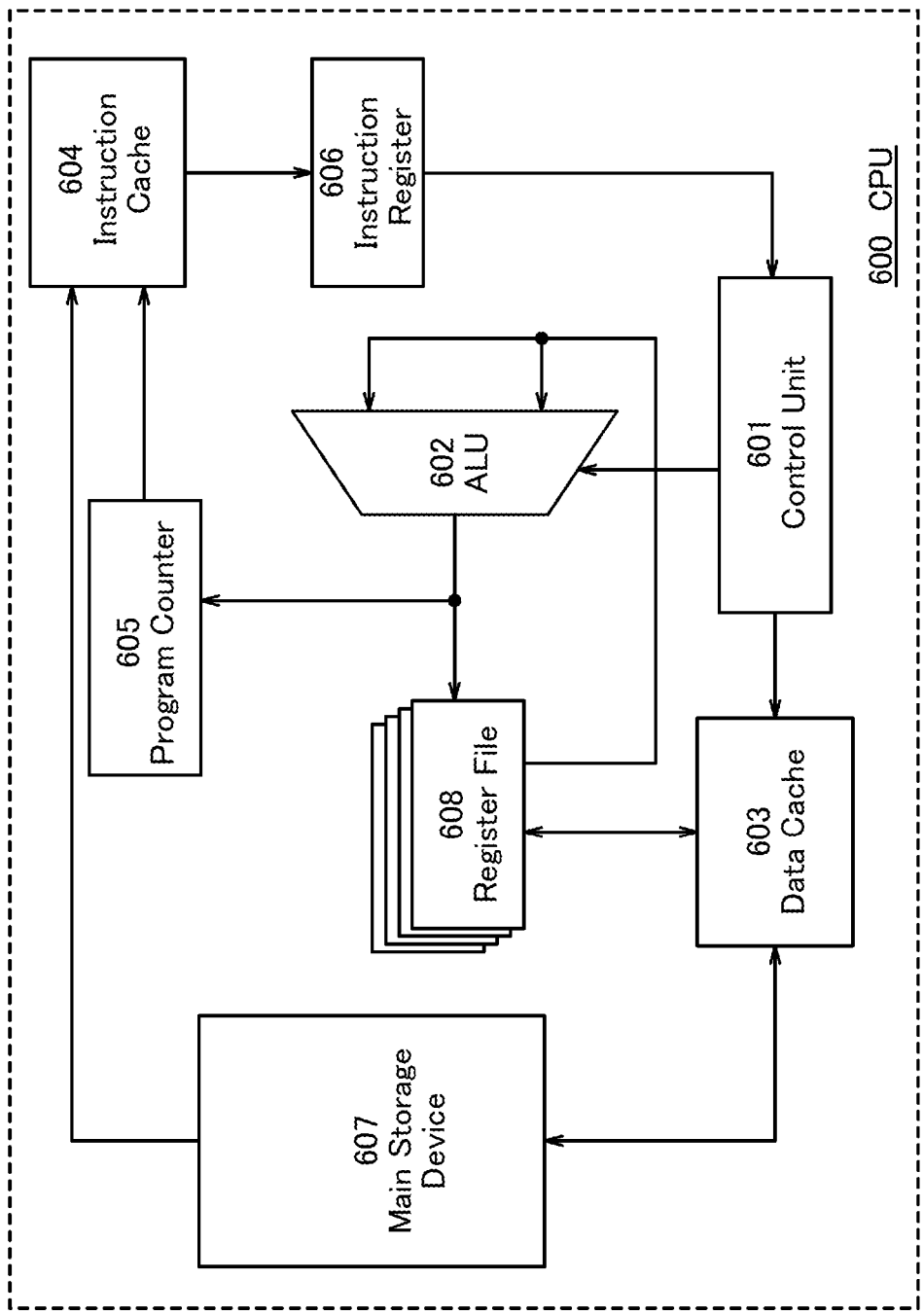
FIG. 11 is a block diagram of a CPU.

FIG. 11 is a block diagram illustrating an example of a CPU of this embodiment.

A CPU 600 includes a control unit 601, an arithmetic logic unit (ALU) 602 corresponding to an arithmetic unit, a data cache 603, an instruction cache 604, a program counter 605, an instruction register 606, a main storage device 607, and a register file 608. In this embodiment, any of the storage devices described in Embodiments 1 to 3 is used for each of the data cache 603 and the instruction cache 604.

The control unit 601 has a function of decoding and carrying out an input instruction. The ALU 602 has a function of performing a variety of arithmetic operations such as four arithmetic operations and logic operations. The data cache 603 is a buffer storage device which temporary stores frequently-used data. The instruction cache 604 is a buffer storage device which temporary stores frequently-used instructions of instructions (programs) sent to the control unit 601. The program counter 605 is a register which stores an address of an instruction to be carried out next. The instruction register 606 is a register which stores an instruction to be carried out next. Data used for the arithmetic operations in the ALU 602 and an instruction which is carried out in the control unit 601 are stored in the main storage device 607. The register file 608 includes a plurality of registers including a general purpose register and can store data which is read from the main storage device 607, data which is obtained during the arithmetic operations in the ALU 602, data which is obtained as a result of the arithmetic operations in the ALU 602, and the like.

Next, the operations of the CPU 600 will be described.

The control unit 601 reads an instruction from an address of the instruction cache 604 corresponding to the address of the instruction to be carried out next which is stored in the program counter 605, and makes the instruction register 606 store the instruction. When the instruction is not stored in the corresponding address of the instruction cache 604, the control unit 601 gets access to a corresponding address of the main storage device 607, reads the instruction from the main storage device 607, and makes the instruction register 606 store the instruction. In this case, the instruction is also stored in the instruction cache 604.

The control unit 601 decodes the instruction stored in the instruction register 606 and carries out the instruction. Specifically, the control unit 601 generates various signals for controlling the operation of the ALU 602 in accordance with the instruction.

When the instruction to be carried out is an arithmetic instruction, the control unit 601 makes the ALU 602 perform arithmetic operations using the data stored in the register file 608, and stores a result of the arithmetic operations in the register file 608.

When the instruction to be carried out is a loading instruction, the control unit 601, first, gets access to a corresponding address of the data cache 603, and checks whether or not a corresponding data exists in the data cache 603. When the corresponding data exists in the data cache 603, the data is copied from the corresponding address of the data cache 603 to the register file 608. When the corresponding data does not exist in the data cache 603, the data is copied from a corresponding address of the main storage device 607 to the corresponding address of the data cache 603, and then the data is copied from the corresponding address of the data cache 603 to the register file 608. Note that in the case where the corresponding data does not exist, since the control unit 601 needs to get access to the low-speed main storage device 607 as described above, it takes long time to carry out the instruction as compared with the case where the control unit gets access to only the buffer storage device such as the data cache 603. However, when not only the above data but also the address of the data and data of addresses of the vicinities of the data in the main storage device 607 are copied to the buffer storage device, second and the subsequent accesses to the address of the data and the addresses of the vicinities thereof in the main storage device 607 can be performed at high speed.

When the instruction to be carried out is a store instruction, the control unit 601 stores data of the register file 608 in a corresponding address of the data cache 603. In this case, the control unit 601, first, gets access to the corresponding address of the data cache 603 and checks whether or not the corresponding data can be stored in the data cache 603. When the data can be stored in the data cache 603, the data is copied from the register file 608 to the corresponding address of the data cache 603. When the data cannot be stored, a new corresponding address is assigned in part of the data cache 603, and the data is copied from the register file 608 to the corresponding address of the data cache 603. Note that the data may be copied to the main storage device 607 immediately after the data is copied to the data cache 603. Alternatively, some pieces of data may be copied to the data cache 603 and then the pieces of data may be collectively copied to the main storage device 607.

Then, after the control unit 601 carries out the instruction, the control unit 601 performs the above operations of getting access to the program counter 605, and decoding and carrying out an instruction read from the instruction register 606 again.

In this embodiment, the use of any of the storage devices described in Embodiments 1 to 3 for each of the data cache 603 and the instruction cache 604 allows reduction in power consumption of the CPU 600.

This application is based on Japanese Patent Application serial no. 2012-105466 filed with the Japan Patent Office on May 2, 2012, the entire contents of which are hereby incorporated by reference.

What is claimed is:

1. A storage device comprising:
    a cache line; and
    a first wiring configured to be supplied with a first power supply potential,
    wherein the cache line includes:
        a data field comprising a first memory cell and a first transistor;
        a tag comprising a second memory cell and a second transistor; and
        a valid bit,
    wherein the first memory cell is electrically connected to the first wiring through the first transistor,
    wherein the second memory cell is electrically connected to the first wiring through the second transistor, and
    wherein gates of the first transistor and the second transistor are electrically connected to the valid bit.

2. The storage device according to claim 1, further comprising a second wiring configured to be supplied with a second power supply potential, a third transistor, and a fourth transistor,
    wherein the first memory cell is electrically connected to the second wiring through the third transistor,
    wherein the second memory cell is electrically connected to the second wiring through the fourth transistor, and
    wherein gates of the third transistor and the fourth transistor are electrically connected to the valid bit.

3. The storage device according to claim 2,
    wherein the first transistor and the second transistor have a first conductivity type,
    wherein the third transistor and the fourth transistor have a second conductivity type, and
    wherein the first conductivity type and the second conductivity type are different from each other.

4. The storage device according to claim 1,
    wherein storage capacity of the valid bit is 1 bit.

5. The storage device according to claim 1,
    wherein the data field is configured to store cache data.

6. The storage device according to claim 1,
    wherein the tag is configured to store address data.

7. The storage device according to claim 1,
    wherein data indicating whether data stored in the data field is valid or invalid is stored in the valid bit.

8. A central processing unit comprising the storage device according to claim 1.

9. A storage device comprising:
    a cache line including a first memory cell, a second memory cell, and a first transistor; and
    a first wiring configured to be supplied with a first power supply potential,
    wherein the first memory cell includes a first data storage circuit which includes a first logic circuit and a second logic circuit,
    wherein an output of the first logic circuit is electrically connected to an input of the second logic circuit, and an output of the second logic circuit is electrically connected to an input of the first logic circuit,
    wherein the second memory cell includes a second data storage circuit which includes a third logic circuit and a fourth logic circuit,
    wherein an output of the third logic circuit is electrically connected to an input of the fourth logic circuit, and an output of the fourth logic circuit is electrically connected to an input of the third logic circuit, and
    wherein a gate of the first transistor is electrically connected to the output of the first logic circuit, one of a source and a drain of the first transistor is electrically connected to the first wiring, and the other of the source and the drain of the first transistor is electrically connected to the third logic circuit and the fourth logic circuit.

10. The storage device according to claim 9, further comprising a second wiring configured to be supplied with a second power supply potential and a second transistor,
    wherein a gate of the second transistor is electrically connected to the output of the second logic circuit, one of a source and a drain of the second transistor is electrically connected to the second wiring, and the other of the source and the drain of the second transistor is electrically connected to the third logic circuit and the fourth logic circuit.

11. The storage device according to claim 10,
    wherein the first transistor and the second transistor have different conductivity types.

12. The storage device according to claim 9,
    wherein each of the first logic circuit, the second logic circuit, the third logic circuit and the fourth logic circuit is an inverter.

13. The storage device according to claim 9,
    wherein each of the first logic circuit, the third logic circuit, and the fourth logic circuit is an inverter, and
    wherein the second logic circuit is a clocked inverter.

14. The storage device according to claim 9,
    wherein each of the first logic circuit and the third logic circuit is an inverter, and
    wherein each of the second logic circuit and the fourth logic circuit is a clocked inverter.

15. A central processing unit comprising the storage device according to claim 9.

16. A storage device comprising:
    a cache line,
    wherein the cache line includes:
        a data field configured to store cache data;
        a tag configured to store address data; and
        a valid bit configured to store valid data indicating whether the cache data stored in the data field is valid or invalid,
    wherein the data field is configured to be supplied with a power supply potential through a first transistor,
    wherein the tag is configured to be supplied with the power supply potential through a second transistor, and
    wherein the first transistor and the second transistor are configured to be turned on or off in accordance with the valid data stored in the valid bit.

17. A driving method of a storage device comprising a cache line and a first wiring supplied with a first power supply potential, wherein the cache line includes a data field configured to store cache data, a tag configured to store address data and a valid bit configured to store valid data indicating whether the cache data stored in the data field is valid or invalid, wherein the tag is electrically connected to the first wiring through a first transistor whose gate is electrically connected to the valid bit, and wherein the data field is electrically connected to the first wiring though a second transistor whose gate is electrically connected to the valid bit, comprising the steps of:

supplying the first power supply potential to the tag and the data field by turning on the first transistor and the second transistor in the case where the valid data indicates that the cache data is valid, and stopping supplying the first power supply potential to the tag and the data field by turning off the first transistor and the second transistor in the case where the valid data indicates that the cache data is invalid.

18. The driving method of a storage device, according to claim 17, wherein storage capacity of the valid bit is 1 bit.

19. The driving method of a storage device, according to claim 17, wherein the storage device further comprising a second wiring supplied with a second power supply potential, wherein the tag is electrically connected to the second wiring through a third transistor whose gate is electrically connected to the valid bit, wherein the data field is electrically connected to the second wiring through a fourth transistor whose gate is electrically connected to the valid bit, wherein in the case where the valid data indicates that the cache data is valid, the first power supply potential is supplied to the tag and the data field by turning on the third transistor and the fourth transistor, wherein in the case where the valid data indicates that the cache data is invalid, supply of the first power supply potential to the tag and the data field is stopped by turning off the third transistor and the fourth transistor, and wherein the second power supply potential is lower than the first power supply potential.

* * * * *